United States Patent [19]

Collins et al.

[11] Patent Number: 5,059,292
[45] Date of Patent: Oct. 22, 1991

[54] SINGLE-CHAMBER APPARATUS FOR IN-SITU GENERATION OF DANGEROUS POLYATOMIC GASES AND RADICALS FROM A SOURCE MATERIAL CONTAINED WITHIN A POROUS FOAMED STRUCTURE

[76] Inventors: George J. Collins, 807 West Oak St., Fort Collins, Colo. 80521; John R. McNeil, 13423 Desert Hills, NE., Albuquerque, N. Mex. 87111; Zeng-gi Yu, 500 W. Prospect Apt. 7C., Fort Collins, Colo. 80526

[21] Appl. No.: 573,891

[22] Filed: Aug. 27, 1990

Related U.S. Application Data

[60] Division of Ser. No. 317,103, Feb. 28, 1989, Pat. No. 4,952,294, which is a continuation of Ser. No. 168,259, Mar. 15, 1988, abandoned.

[51] Int. Cl.$^5$ .............................................. C10G 35/00
[52] U.S. Cl. ................................ 204/164; 204/298.07; 204/298.09; 204/298.12; 204/192.11; 156/345; 422/186.04; 422/186.22; 422/186.25; 422/186.29; 422/186.30; 422/31
[58] Field of Search ...................... 204/298.07, 298.09, 204/298.12, 164; 156/345; 422/186, 186.04, 186.21, 186.22, 186.25, 186.29, 186.30, 21

[56] References Cited

U.S. PATENT DOCUMENTS

| 3,856,654 | 12/1974 | George | 204/298 |
| 3,895,602 | 7/1975 | Bobenreigh | 118/726 |
| 4,492,620 | 1/1985 | Matsuo et al. | 204/192 R |
| 4,522,674 | 6/1985 | Ninomiya et al. | 204/298.33 |
| 4,664,769 | 5/1987 | Cuomo et al. | 204/192.1 |
| 4,680,507 | 7/1987 | Uemura et al. | 315/111.81 |

FOREIGN PATENT DOCUMENTS 8000713  4/1980  World Int. Prop. O. ...... 204/192.11

OTHER PUBLICATIONS

Naitoh et al., "MoCVD Growth of InP Using Red-Phosphorous and Hydrogen Plasma" Jap. Journal of Applied Physics, vol. 26, pp. L1538-L1539.

Primary Examiner—T. Tung
Assistant Examiner—Kathryn Gorgos
Attorney, Agent, or Firm—William E. Hein

[57] ABSTRACT

A single-chamber apparatus and method are described for in-situ generation of dangerous polyatomic gases and radicals from solid or liquid source materials contained within a porous foamed structure. A cooled cathode is provided for establishing a plasma discharge within the chamber, and a heat source is provided to maintain the porous foamed structure within a fixed temperature range chosen such that the source material is removed from the porous foamed structure by evaporation induced by heat from the heat source while at the same time preventing consumption by evaporation of the porous foamed structure itself.

32 Claims, 14 Drawing Sheets

SINGLE-CHAMBER APPARATUS FOR IN-SITU GENERATION OF DANGEROUS POLYATOMIC GASES AND RADICALS FROM A SOURCE MATERIAL CONTAINED WITHIN A POROUS FOAMED STRUCTURE

This is a division of application Ser. No. 07/317,103 filed Feb. 28, 1989, now issued as U.S. Pat. No. 4,952,294, which is in turn a continuation of application Ser. No. 07/168,259 filed Mar. 15, 1988, now abandoned.

REFERENCE TO RELATED APPLICATIONS AND PATENTS

This application is related to the subject matter of U.S. patent application Ser. No. 000,475 entitled Ultraviolet Metal Ion Laser filed Jan. 5, 1987, by George J. Collins et al. now U.S. Pat. No. 4,730,334 and of U.S. patent application Ser. No. 144,750 entitled Hermetic Coating of Optical Fibers filed Jan. 19, 1988, by George J. Collins et al. now U.S. Pat. No. 4,863,576 and of U.S. patent application Ser. No. 079,879 entitled Magnetron Deposition of Ceramic Oxide-Superconductor Thin Films filed July 29, 1987, by George J. Collins et al. now U.S. Pat. No. 4,842,704 and of U.S. patent application Ser. No. 827,336 entitled In-Situ Wide Area Vacuum Ultraviolet Lamp filed Feb. 7, 1986, by George J. Collins et al. now U.S. Pat. No. 4,782,267 and of U.S. Pat. No. 4,496,449 entitled Electron Beam Etching of Integrated Circuits and of U.S. Pat. No. 4,641,316 entitled D.C. Electron Beam Method of Continuous Laser Excitation. The subject matter of the foregoing patent applications and patents is incorporated herein by reference.

BACKGROUND OF THE INVENTION

The use of toxic, corrosive and explosive polyatomic gases is common to microelectronic and electro-optic thin film fabrication processes, such as chemical vapor deposition, epitaxy, ion implantation and doping. The polyatomic gases are one convenient source of a desired elemental species of interest. Safety issues require extreme care in the handling, storage and use of such toxic polyatomic gases at considerable extra cost to the end users. Limits on the maximum amount of toxic gas stored in a given location introduce additional operating costs due to the need for frequent gas bottle replacement on a given apparatus in a manufacturing eviroment. Finally, total dose limitations received by workers over a given time restrict the scheduling of workers in a work week where exposure to toxic chemicals occurs. Thus, for example, exposure to arsenic and its compounds should not exceed 0.5 mg/(Meter)$^3$ over a forty hour work week.

The volatile nature of liquid and gaseous forms of dangerous chemicals makes their containment and control especially problematic. If a leak should ever occur, the danger spreads quickly over a wide area. Special gas and liquid storage facilities, and special gas handling lines and regulators are all used in conventional toxic chemical support technology. Toxic gas monitoring equipment, including audible and visual alarms, must be used should an inadvertent release of dangerous gas or liquid ever occur. Finally, evacuation of manufacturing personnel from the entire manufacturing facility is required when a dangerous gas release occurs, not just the immediate vicinity of the toxic gas leak because only ppm or ppb levels are dangerous. This evacuation requirement involves additional cost and down time.

Direct and rapid control of dangerous species generation is the lynchpin of the present invention. This is to be compared to prior art furnace technology and downstream microwave plasma dangerous gas generation methods. See, for example, "MOCVD Growth of InP Using Red Phosphorous and a Hydrogen Plasma" by Masami Naitoh and Masayoshi Umeno, Japanese Journal of Applied Physics 26, 1538-1539 (1987). Like Naitoh and Umeno, our approach places the dangerous gas generation source inside a vacuum chamber safe from the immediate manufacturing enviroment. The approach of the present invention is distinguished from the prior art by its use of photon, electron or ion beam impingement on the solid target to produce the elemental species of interest, and by the use of refractory metal or ceramic foam-like structure to contain the dangerous elemental containing species in the pores.

SUMMARY OF THE INVENTION

It is desired to have new sources of required microelectronic or electro-optic materials that are in a less dangerous form and easier to handle than those used in the conventional art. The present invention is directed to the in-situ generation of dangerous and toxic gases using a four fold approach entailing: solid elemental or compound target sources, one or more gaseous feedstock sources, a plasma rapidly generated and rapidly extinguished in a partial vacuum, and beam impingement on the target to rapidly evolve the elemental species of interest. Only when all four are present will the desired but dangerous gas production occur. Without any one of the four required constituents, no gas generation will occur. This allows for failsafe and rapid control of the dangerous gas generation should an inadvertent leak occur downstream from the source.

Detailed below is the case of in-situ generation of hydride gases using solid sources irradiated by electron, photon or ion beams and atomic hydrogen radicals generated upstream or downstream in a partial vacuum by a plasma in a hydrogen bearing feedstock. This discussion is illustrative for hydrides but can clearly be extended to the generation of other dangerous and volatile gases, such as halides, oxides, nitrides, etc. Note that atomic hydrogen can be generated in a plasma from molecular hydrogen. However, since molecular hydrogen is a potentially explosive gas itself, other hydrogen bearing gases such as $NH_3$ can also be used to generate atomic hydrogen radicals without the potential danger that $H_2$ brings. For example, the plasma itself creates H, H*, and $H_2$ inside the partial vacuum from feedstock $NH_3$ gas.

The present approach uses beams of ions, electrons or photons to bombard target surfaces to rapidly produce elemental species of interest in gaseous form. This is accomplished either thermally or by physical sputtering, thereby introducing desired elemental species into the gaseous feedstock plasma. Use of conventional, as well as rapid heating and rapid cooling thermal stages, which do not use beam impingement heating is also considered possible. Note that a tandem series of elemental targets or one multi-component target would make possible simultaneous multi-component polyatomic gas generation. Elemental species generation using the beam impingement techniques mentioned can be done either on a continuous or pulsed basis. Pulsed operation is not achievable using prior art methods such as those of Naitoh and Umeno. The targets used may be constructed of the elemental species of interest, or they may be made of elemental containing compounds. In addition, the use of refractory foam enclosures for the elemental containing species allows for safe storage of large volumes. Finally, refractory metal, glass, or ceramic foam-like structures allow for capillary action wick feeding of the elemental containing species to the surface from the bulk volume below. Similarly, the element or elemental containing compounds may constitute one or more components of a multi-component target. Following beam impingement the elemental species of interest evolve from the target into a hydrogen plasma (for hydride generation). The plasma is ignited in a molecular hydrogen or hydrogen bearing gas. The plasma is populated by both excited and ground state atomic and molecular species, which are free radicals and able to rapidly react with the elemental species to form polyatomic hydride gases.

One or more plasmas can be used for simultaneous creation of both the elemental species of interest from the target via beam impingement as well as to create atomic hydrogen from feedstock gases. This is accomplished, for example, either in a low pressure ($10^{-4}$ Torr to $10^{-2}$ Torr) magnetron discharge where the cathode contains the elemental species of interest and an external magnetic field exists or in a high pressure (greater than $10^{-2}$ Torr) discharge mode without an external magnetic field. In the case of elemental species generation, the discharge generates an ion flux which impinges on the target. The ion flux impinging on the target acts to either physically sputter elemental species or to heat the cathode and thermally evolve the elemental species. Mixtures of hydrogen bearing gases with one or more rare gases will alow for more efficient sputtering. A soft-vacuum electron beam, created in a plasma and impinging on a target, can also simultaneously create elemental species via target heating as described below in case (2). The energetic electrons present in the low pressure magnetron discharge, the high pressure discharge, or the electron beam discharge can dissociate hydrogen bearing feedstock gases to create atomic hydrogen radicals. Both gas phase homogeneous reactions and surface assisted heterogeneous reactions act in concert to gasify the elemental species evolved from the target into a polyatomic gas. This polyatomic gas can subsequently be readily flowed from the in-situ dangerous gas generation source into a remote external apparatus where it is used to fabricate thin films (e.g. epitaxy, ion implantation, chemical vapor deposition and doping).

In the case of beam generated elemental species generation the target is typically externally cooled. The target is heated only when the electron, ion or photon beam is present. Pulsed heating of the target surface allows for the transient generation of small quantites of the desired elemental species from the target. This may be more desirable in some applications than continuous generation. External cooling is used to minimize any inadvertent thermal generation when beam irradiation of the target ceases. Hence, the evolution of elemental species from the target occurs only with the presence of the beam on the target. Without target cooling, inadvertent thermal generation of species from the target could occur during the period after beam impingement ceases while the target returns to a lower temperature. In the case of elements of very low vapor pressure (e.g. boron, gallium, etc), in which conventional thermal generation is not practical, the present invention involving beam impingement on targets represents an especially useful mechanism, because the elemental species can be generated from the target surface without elevating the bulk target to a very high temperature.

The plasma with hydrogen bearing gases may be produced on a continuous or pulsed basis using conventional d.c., a.c., r.f., microwave and electron beam excited discharges. Care must be taken to minimize the recombination of atomic hydrogen into molecular hydrogen so that rapid chemical reaction of the desired elemental species, A, with atomic hydrogen occurs to form radicals of the single element form AH, $AH_2$,...$AH_{N-1}$ to $AH_N$, or of the double element form $A_2H$, $A_2H_2$,....$A_2H_{N-1}$ to $A_2H_N$. The final stable gaseous form of the hydride desired is usually $AH_N$ or $A_2H_N$ for the single element and bi-element molecule, respectively. For illustrative purposes starting with elemental P, As, Si, Se and B, the stable polyatomic gases $PH_3$, $AsH_3$, $SiH_4$, $H_2Se$ and $B_2H_6$, respectively, would be formed using the process of the present invention. Hence, N is 3, 3, 4 and 2 for $PH_3$, $AsH_3$, $SiH_4$, and $H_2Se$, respectively, and 6 for $B_2H_6$.

Below are outlined three specific beam methods of evolving desired species, A, from a target using photon, electron and ion bombardment either on a continuous or pulsed basis. A fourth method of evolving the desired species uses heating of a foam structure which holds the dangerous elemental containing species. The heating may use conventional resistive or r.f. methods or employ beams. In all cases, a plasma is used to generate excess atomic hydrogen radicals so that the illustrative stable polyatomic gases $AH_N$ or $A_2H_N$ are formed. In most applications the radicals AH, $AH_2$,..... $AH_{N-1}$, as well as $A_2H$, $A_2H_2$,...$A_2H_{N-1}$ also created by this method are not considered deleterious to subsequent fabrication processes should they occur. A commercially available rapid thermal heating and cooling device can also be used to evaporate the elemental form or compound form of the desired species A. The rapid cool capability provides for safety as well as for pulsed thermal operation. The thermal time constant of bulk targets limits the cycle time of this method as compared to beam impingement. Three specific elemental species generation methods using beam impingement are described below. Of the possible three beams, one of them, photons, electrons, or ions may be best suited for absorption on a given specific target. Finally, photon, electron and ion beams may be used either alone or in combination as follows:

(1) A pulsed or continuous laser or lamp is used as a photon beam heat source impinging on the target surface. It is introduced into the vacuum chamber where the desired species, A, or a compound of A is located. The target containing the desired species, A, could exist as a solid (powder, granules, lump, or large area solid) or as a liquid held in a reservoir inside the vacuum chamber. Similarly, the species, A, could constitute a portion of the solid or liquid target held in a reservoir inside the vacuum chamber. The vapor of the desired species, A, is formed in the chamber when the photon beam is absorbed and heats the surface of elemental or compound species. The vapor of desired species, A, evolves following target irradiation and reacts with the plasma generated atomic hydrogen radicals to form the illustrative, AH, $AH_2$,.....and $AH_N$, inside the vacuum chamber. Selective photon heating of the surface of the target rather than the bulk of the target or the reservoir avoids the problem of reservoir impurities evolving at the elevated evaporation temperatures required for species A, and allows for rapid turn-on and turn-off of the evaporated species. A series of tandem elemental sources or a single multi-component source is also possible resulting in simultaneous generation of several polyatomic gases;

(2) A soft-vacuum electron beam generated in a glow discharge and impinging on the target surface is used as a pulsed or continuous beam heat source to evaporate the desired elemental species, A, into the vacuum chamber. In this case, a wide area beam (greater than 20 cm$^2$) may be generated in contrast to the small area laser beam of case (1). Again, beam heating of the target surface composed of elemental A or a compound of A avoids bulk target or reservoir heating and associated thermally generated impurity problems. It also allows for rapid thermal ramp-up and ramp-down of the target surface to evaporating and non-evaporating temperatures. Finally, the electron beam itself may create a beam generated hydrogen plasma in-situ as it passes from the cold cathode through the ambient hydrogen bearing gas toward the target containing the desired elemental species A. A series of tandem elemental targets or one multi-component target is also possible resulting in simultaneous generation of several polyatomic gases;

(3) A discharge sputtering device of planar or cylindrical geometry located inside the vacuum chamber, acting as an ion beam heat or ion beam sputtering source provides for generation of elemental species from the cathode target surface constructed to contain the desired species A. The discharge may operate either in a low pressure ($10^{-4}$ Torr to $10^{-2}$ Torr) magnetron discharge mode with an external magnetic field or in a high pressure (greater than $10^{-2}$ Torr) discharge mode without an external magnetic field. Note that the ion bombardment either physically sputters the desired species A from the cathode target or the ion bombardment heats the cathode target to cause thermal evaporation. Mixtures of hydrogen bearing gases with one or more rare gases will alow for more efficient sputtering. The vapor of the desired species A then reacts with the atomic hydrogen radicals generated by a plasma to form a volatile polyatomic gas. A series of several tandem cathodes each with an elemental species or a single multi-component cathode allows for simultaneous generation of several polyatomic gases;

(4) A foamed structure is used to contain the material having the desired elemental species A in its pores. Typically, the foamed material is a refractory metal, such as Tungsten (W) or Tantalum (Ta), or it is a porous ceramic or a porous glass. The substance having the desired elemental species A, having been previously melted and absorbed into the pores of the foamed structure, is subsequently released in vapor form from the surface of the structure upon being heated. Heating can be accomplished using standard techniques, such as resistive heating or r.f. heating mechanisms, or ion, electron or photon beam impingement can be used for heating. The foamed structure provides a wicking mechanism for the material having the desired elemental species, by replenishing the material which is released at the surface of the structure with material from within the foamed structure. In this manner, the foamed structure provides a convenient reservoir for the desired elemental species. The arrangement is rugged, can be oriented in geometries without regard to gravity, and it is long lived, as large amounts of the desired elemental species can be incorporated into the pores of the foamed structure. It is especially convenient for species which are in liquid form at the temperature required for vapor generation. The vapor of the desired species A then reacts with the atomic hydrogen radicals generated by a plasma to form a volatile polyatomic gas. A combination of several foamed structures, each with an elemental species can be used for simultaneous generation of several polyatomic gasses. Similarly, a single foamed structure can be used to contain more than one desired elemental species, and this can be used to simultaneously generate several polyatomic gasses.

BRIEF DESCRIPTION OF THE DRAWINGS

FIG. 1 (b) is cross-sectional representation of the two-chamber apparatus for in-situ generation of dangerous polyatomic gases in accordance with the present invention, with the use of a single extraction grid between chambers, by using either a photon beam or a soft-vacuum electron beam as a heat source for creating the vapor of the desired species and a separate configuration for creating a tandem atomic hydrogen plasma, where the direction of hydrogen bearing feedstock gas flux is from the plasma chamber toward the vacuum chamber.

FIG. 1 (c) is cross-sectional representation of the two-chamber apparatus for in-situ generation of dangerous polyatomic gases in accordance with the present invention, with the use of dual extraction grids between chambers, by using either a photon beam or a soft-vacuum electron beam as a heat source for creating the vapor of the desired species and a separate configuration for creating a tandem atomic hydrogen plasma, where the direction of hydrogen bearing feedstock gas flux is from the plasma chamber toward the vacuum chamber.

FIG 1 (d) is cross-sectional representation of the two-chamber apparatus for in-situ generation of dangerous polyatomic gases in accordance with the present invention, without the use of extraction grids between chambers, by using either a photon beam or a soft-vacuum electron beam as a heat source for creating the vapor of the desired species and a separate configuration for creating a tandem atomic hydrogen plasma, where the direction of hydrogen bearing feedstock gas flux is from the vacuum chamber toward the plasma chamber.

FIG. 2 (b) is cross-sectional representation of the two chamber apparatus for in-situ generation of dangerous polyatomic gases in accordance with the present invention, with the use of a single extraction grid between chambers, by using a discharge sputtering apparatus for creating the vapor of the desired species and a separate configuration for creating an atomic hydrogen plasma, where the direction of hydrogen bearing feedstock gas flux is from the plasma chamber toward the discharge sputtering chamber.

FIG. 2 (c) is cross-sectional representation of the two chamber apparatus for in-situ generation of dangerous polyatomic gases in accordance with the present invention, with the use of dual extraction grids between chambers, by using a discharge sputtering apparatus for creating the vapor of the desired species and a separate configuration for creating an atomic hydrogen plasma, where the direction of hydrogen bearing feedstock gas flux is from the plasma chamber toward the discharge sputtering chamber.

FIG. 2 (d) is cross-sectional representation of the two chamber apparatus for in-situ generation of dangerous polyatomic gases in accordance with the present invention, without the use of extraction grids between chambers, by using a discharge sputtering apparatus for creating the vapor of the desired species and a separate configuration for creating an atomic hydrogen plasma, where the direction of hydrogen bearing feedstock gas flux is from the discharge sputtering chamber toward the plasma chamber.

FIG. 4 (b) is cross-sectional representation of a self-contained formed material structure whose pores act as reservoirs of material containing a desired elemental species A for in-situ generation of dangerous polyatomic gases in accordance with the present invention, in which a vapor containing the desired elemental species A is generated in the discharge sputtering chamber.

FIG. 4 (c) is cross-sectional representation of self-contained foamed material structure whose pores act as reservoirs of material containing a desired elemental species A for in-situ generation of dangerous polyatomic gases in accordance with the present invention, in which a vapor containing the desired elemental species A is generated within the single chamber apparatus by using resistive, r.f., electron beam, ion beam, or photon beam heating mechanisms, in which the self-contained foamed material structure is located upstream of the discharge.

FIG. 4 (d) is cross-sectional representation of self-contained foamed material structure whose pores act as reservoirs of material containing a desired elemental species A for in-situ generation of dangerous polyatomic gases in accordance with the present invention, in which a vapor containing the desired elemental species A is generated within the single chamber apparatus by using resistive, r.f., electron beam, ion beam, or photon beam heating mechanisms, in which the self-contained foamed material structure is located downstream of the disharge.

FIG. 4 (e) is cross-sectional representation of self-contained foamed material structure whose pores act as reservoirs of material containing a desired elemental species A for in-situ generation of dangerous polyatomic gases in accordance with the present invention, in which a vapor containing the desired elemental species A is generated within the single chamber apparatus by using resistive, r.f., electron beam, ion beam, or photon beam heating mechanisms, in which the self-contained foamed material structure is located within the discharge.

DESCRIPTION OF THE ILLUSTRATED EMBODIMENT OF THE INVENTION

Figure 1:
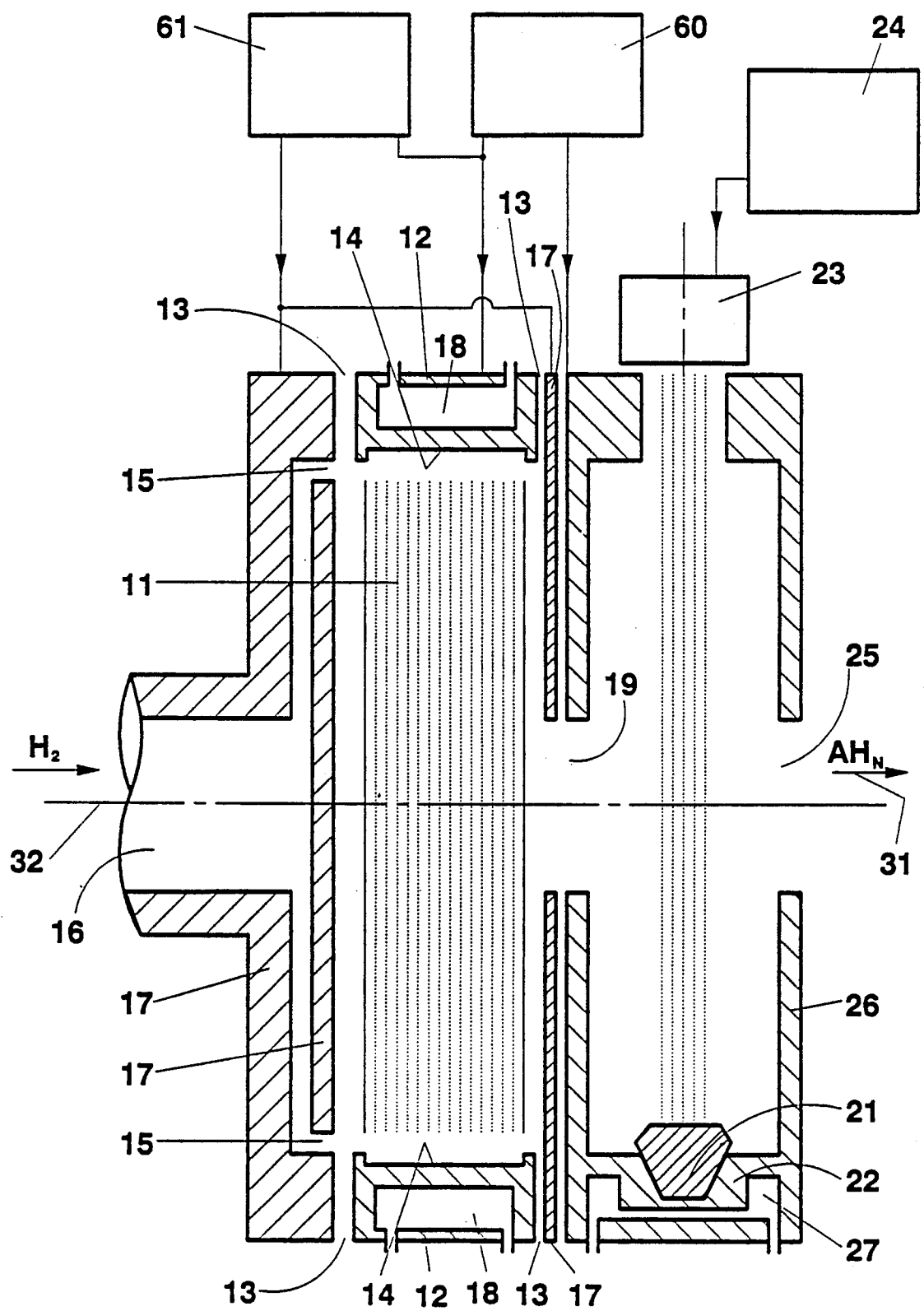
FIG. 1 (a) is cross-sectional representation of the two-chamber apparatus for in-situ generation of dangerous polyatomic gases in accordance with the present invention, without the use of extraction grids between chambers, by using either a photon beam or a soft-vacuum electron beam as a heat source for creating the vapor of the desired species and a separate configuration for creating a tandem atomic hydrogen plasma, where the direction of hydrogen bearing feedstock gas flux is from the plasma chamber toward the vacuum chamber.
Figure 1:
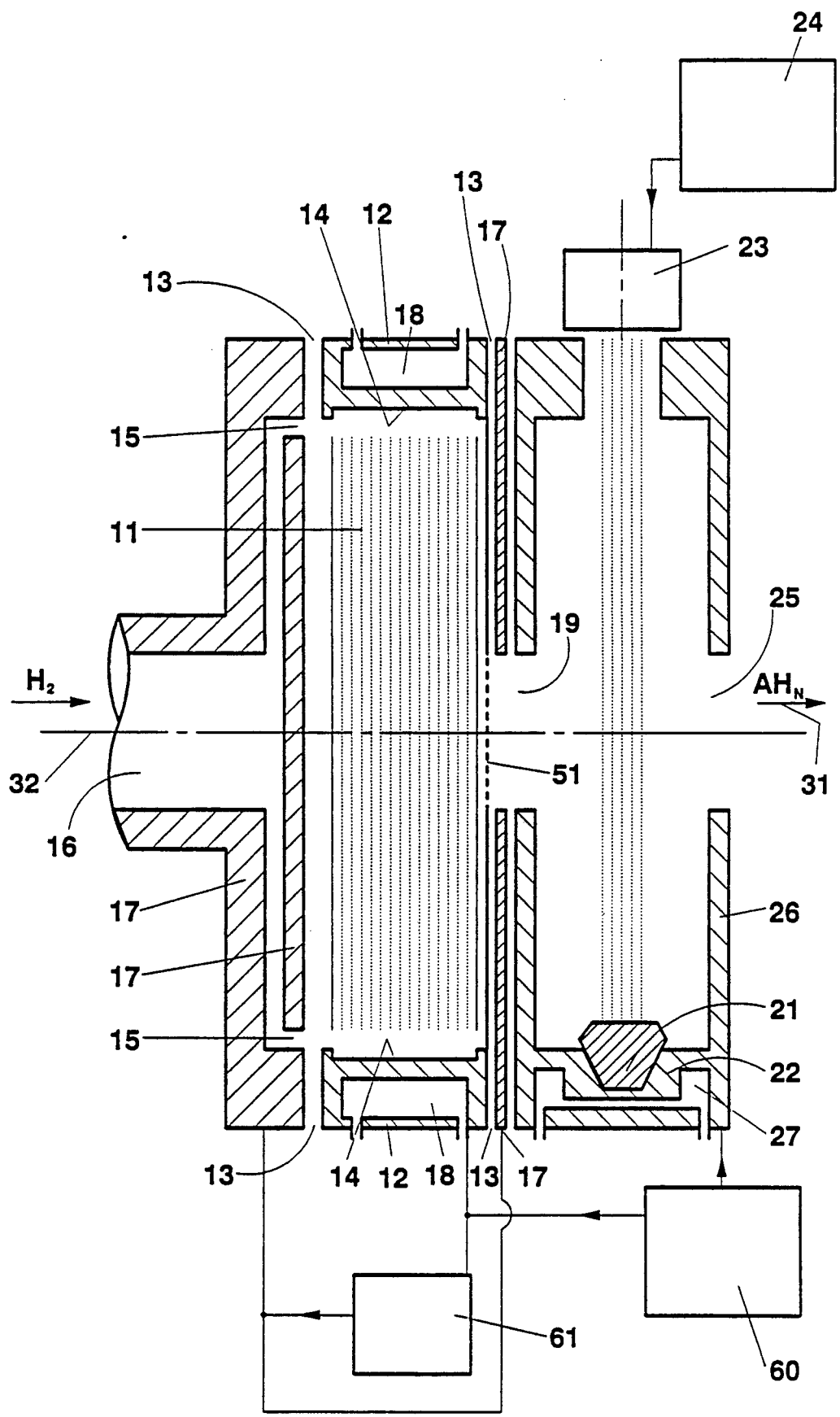
Figure 1:
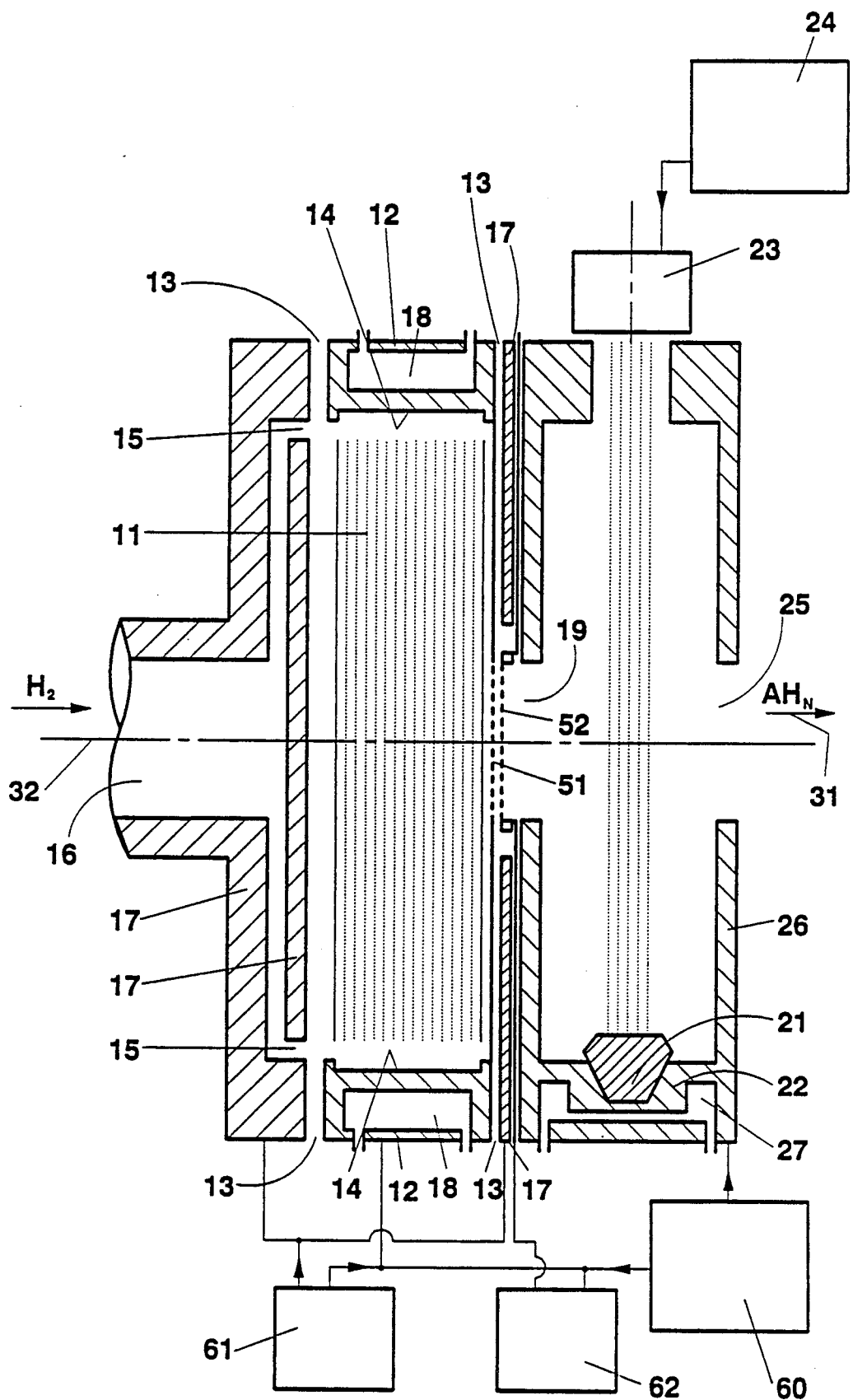
Figure 1:
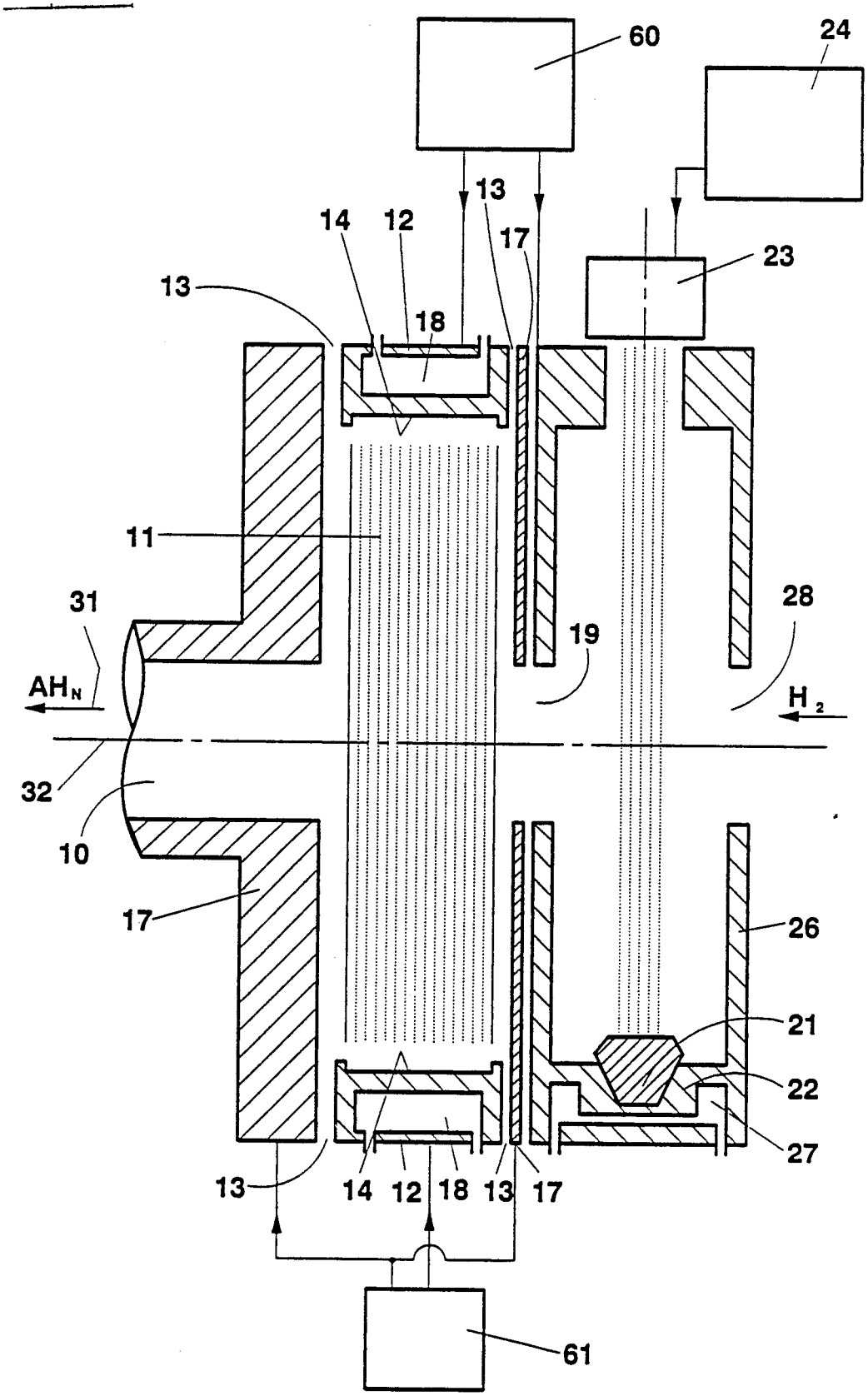

Referring now to FIG. 1 (a), there is shown a cross-sectional pictorial representation of a two-chamber apparatus for in-situ generation of dangerous polyatomic gases in accordance with the present invention. A plasma chamber 17 surrounds a pair of opposing cold cathodes 12 and a vacuum chamber 26 contains an elemental species 21. An inner surface 14 of the opposing cold cathodes 12 emits secondary electrons in a beam form following ion bombardment, metastable impingement, or the absorption of a VUV photon. The secondary electrons are accelerated in the electric field, thus providing a plasma discharge 11. The opposing cold cathodes 12 act to contain energetic electrons by electrostatic reflection. The opposing cold cathodes 12 may be planar or may be formed from a single cathode of cylindrical or ring shape. The plasma discharge 11 may operate either in a low pressure ($10^{-4}$ Torr to $10^{-2}$ Torr) magnetron discharge mode with an external magnetic field directed essentially parallel to the longitudinal axis 32 or in a high pressure (greater than $10^{-2}$ Torr) discharge mode without an external magnetic field. In the preferred embodiment, the grounded metal wall of the plasma chamber 17 is used as the discharge anode. The plasma discharge 11 excites the feedstock ambient gas via electron-atom and electron-molecule collisions. For example, using molecular hydrogen or ammonia as the feedstock gas, the plasma discharge 11 acts as a source of atomic hydrogen radicals. The plasma chamber 17 is adjacent to the opposing cold cathodes 12, and has a spacing 13 to prevent a discharge from occuring in the area beside the inner surface 14 of the opposing cold cathodes 12. A conventional Kaufman electron source is an alternative choice to the cold cathode glow discharge as an electron beam generator. A Kaufman electron source would provide for operation at a significantly lower gas pressure-and, hence, could be more compatible with material processes requiring low ambient pressure operation such as ion implantation. Gas port 16 and purging jets 15 provide a flow of hydrogen bearing gases for the plasma discharge 11 in the plasma chamber 17. A conventional cooling chamber 18 and coolant flow therein provide for heat removal from the opposing cold cathodes 12. The atomic hydrogen radicals produced in plasma discharge 11 flow out through an opening 19 from the plasma chamber 17 into the vacuum chamber 26. A conventional d.c. or a.c. power supply 60 is connected between the opposing cold cathodes 12 and the vacuum chamber 26. In this manner, the applied electrical bias causes additional atomic and molecular hydrogen ion extraction from the plasma discharge 11. This is especially useful when operating at reduced pressures. A conventional d.c. or a.c. power supply 61 is connected between the opposing cold cathodes 12 and the plasma chamber 17 to create plasma discharge 11.

The vacuum chamber 26 contains the desired elemental species 21 in its reservoir 22 surrounded by a cooled jacket 27. Either a laser or lamp photon source or a soft-vacuum electron beam source 23 provides the heat required for evaporation of the desired elemental species. A conventional d.c., a.c., or pulsed power supply 24 drives the lamp, laser or electron beam. A polyatomic gas product 31 flows out through an exit 25, and is ready to be used for epitaxy, ion implantation, chemical vapor deposition and doping.

Referring now to FIG. 1 (b), there is shown a cross-sectional pictorial representation of a two-chamber apparatus for in-situ generation of dangerous polyatomic gases in accordance with the present invention. A plasma chamber 17 surrounds a pair of opposing cold cathodes 12 and a vacuum chamber 26 contains an elemental species 21. An inner surface 14 of the opposing cold cathodes 12 emits secondary electrons in a beam form following ion bombardment, metastable impingement, or the absorption of a VUV photon. The secondary electrons are accelerated in the electric field, thus providing a plasma discharge 11. The opposing cold cathodes 12 act to contain energetic electrons by electrostatic reflection. The opposing cold cathodes 12 may be planar or may be formed from a single cathode of cylindrical or ring shape. The plasma discharge 11 may operate either in a low pressure ($10^{-4}$ Torr to $10^{-2}$ Torr) magnetron discharge mode with an external magnetic field directed essentially parallel to the longitudinal axis 32 or in a high pressure (greater than $10^{-2}$ Torr) discharge mode without an external magnetic field. In the preferred embodiment, the grounded metal wall of the plasma chamber 17 is used as the discharge anode. The plasma discharge 11 excites the feedstock ambient gas via electron-atom and electron-molecule collisions. For example, using molecular hydrogen or ammonia as the feedstock gas, the plasma discharge 11 acts as a source of atomic hydrogen radicals. The plasma chamber 17 is adjacent to the opposing cold cathodes 12, and has a spacing 13 to prevent a discharge from occuring in the area beside the inner surface 14 of the opposing cold cathodes 12. A conventional Kaufman electron source is an alternative choice to the cold cathode glow discharge as an electron beam generator. A Kaufman electron source would provide for operation at a significantly lower gas pressure, and hence could be more compatible with material processes requiring low ambient pressure operation such as ion implantation. Gas port 16 and purging jets 15 provide a flow of hydrogen bearing gases for the plasma discharge 11 in the plasma chamber 17. A conventional cooling chamber 18 and coolant flow therein provide for heat removal from the opposing cold cathodes 12. The atomic hydrogen radicals produced in plasma discharge 11 flow out through an opening 19 from the plasma chamber 17 into the vacuum chamber 26. A single extraction grid 51 on one open end of the opposing cold cathodes 12 covers the opening 19 to better extract the atomic and molecular hydrogen ions toward the vacuum chamber 26. A conventional d.c. or a.c. power supply 60 is connected between the opposing cold cathodes 12 and the vacuum chamber 26. In this manner, the applied electrical bias causes additional atomic and molecular hydrogen ion extraction from the plasma discharge 11. This is especially useful when operating at reduced pressures. A conventional d.c. or a.c. power supply 61 is connected between the opposing cold cathodes 12 and the plasma chamber 17 to create plasma discharge 11.

The vacuum chamber 26 contains the desired elemental species 21 in its reservoir 22 surrounded by a cooled jacket 27. Either a laser or lamp photon source or a soft-vacuum electron beam source 23 provides the heat required for evaporation of the desired elemental species. A conventional d.c., a.c., or pulsed power supply 24 drives the lamp, laser or electron beam. A polyatomic gas product 31 flows out through an exit 25, and is ready to be used for epitaxy, ion implantation, chemical vapor deposition and doping.

Referring now to FIG. 1 (c), there is shown a cross-sectional pictorial representation of a two-chamber apparatus for in-situ generation of dangerous polyatomic gases in accordance with the present invention. A plasma chamber 17 surrounds a pair of opposing cold cathodes 12 and a vacuum chamber 26 contains an elemental species 21. An inner surface 14 of the opposing cold cathodes 12 emits secondary electrons in a beam form following ion bombardment, metastable impingement, or the absorption of a VUV photon. The secondary electrons are accelerated in the electric field, thus providing a plasma discharge 11. The opposing cold cathodes 12 act to contain energetic electrons by electrostatic reflection. The opposing cold cathodes 12 may be planar or may be formed from a single cathode of cylindrical or ring shape. The plasma discharge 11 may operate either in a low pressure ($10^{-4}$ Torr to $10^{-2}$ Torr) magnetron discharge mode with an external magnetic field directed essentially parallel to the longitudinal axis 32 or in a high pressure (greater than $10^{-2}$ Torr) discharge mode without an external magnetic field. In the preferred embodiment the grounded metal wall of the plasma chamber 17 is used as the discharge anode. The plasma discharge 11 excites the feedstock ambient gas via electron-atom and electron-molecule collisions. For example, using molecular hydrogen or ammonia as the feedstock gas, the plasma discharge 11 acts as a source of atomic hydrogen radicals. The plasma chamber 17 is adjacent to the opposing cold cathodes 12, and has a spacing 13 to prevent a discharge from occuring in the area beside the inner surface 14 of the opposing cold cathodes 12. A conventional Kaufman electron source is an alternative choice to the cold cathode glow discharge as an electron beam generator. A Kaufman electron source would provide for operation at a significantly lower gas pressure and, hence, could be more compatible with material processes requiring low ambient pressure operation such as ion implantation. Gas port 16 and purging jets 15 provide a flow of hydrogen bearing gases for the plasma discharge 11 in the plasma chamber 17. A conventional cooling chamber 18 and coolant flow therein provide for heat removal from the opposing cold cathodes 12. The atomic hydrogen radicals produced in plasma discharge 11 flow out through an opening 19 from the plasma chamber 17 into the vacuum chamber 26. Dual extraction grids 51 and 52 cover the opening 19 to better extract the atomic and molecular hydrogen ions towards the vacuum chamber 26. Grid 51 is connected to the opposing cold cathodes 12. Grid 52 is connected to a conventional d.c. or a.c. power supply 62. A conventional d.c. or a.c. power supply 60 is connected between the opposing cold cathodes 12 and the vacuum chamber 26. In this manner, the applied electrical bias causes additional atomic and molecular hydrogen ion extraction from the plasma discharge 11. This is especially useful when operating at reduced pressures. A conventional d.c. or a.c. power supply 61 is connected between the opposing cold cathodes 12 and the plasma chamber 17 to create plasma discharge 11.

The vacuum chamber 26 contains the desired elemental species 21 in its reservoir 22 surrounded by a cooled jacket 27. Either a laser or lamp photon source or a soft-vacuum electron beam source 23 provides the heat required for evaporation of the desired elemental species. A conventional d.c., a.c., or pulsed power supply 24 drives the lamp, laser or electron beam. A polyatomic gas product 31 flows out through an exit 25, and is ready to be used for epitaxy, ion implantation, chemical vapor deposition and doping.

Referring now to FIG. 1 (d), there is shown a cross-sectional pictorial representation of a two-chamber apparatus for in-situ generation of dangerous polyatomic gases in accordance with the present invention. The apparatus shown in FIG. 1 (d) is the same as that shown in FIG. 1 (a) except that the flow of gases is in the opposite direction. A plasma chamber 17 surrounds a pair of opposing cold cathodes 12 and a vacuum chamber 26 contains an elemental species 21. An inner surface 14 of the opposing cold cathodes 12 emits secondary electrons in a beam form following ion bombardment, metastable impingement, or the absorption of a VUV photon. The secondary electrons are accelerated in the electric field, thus providing a plasma discharge 11. The opposing cold cathodes 12 act to contain energetic electrons by electrostatic reflection. The opposing cold cathodes 12 may be planar or may be formed from a single cathode of cylindrical or ring shape. The plasma discharge 11 may operate either in a low pressure ($10^{-4}$ Torr to $10^{-2}$ Torr) magnetron discharge mode with an external magnetic field directed essentially parallel to the longitudinal axis 32 or in a high pressure (greater than $10^{-2}$ Torr) discharge mode without an external magnetic field. In the preferred embodiment, the grounded metal wall of the plasma chamber 17 is used as the discharge anode. The plasma discharge 11 excites the feedstock ambient gas via electron-atom and electron-molecule collisions. For example, using molecular hydrogen or ammonia as the feedstock gas, the plasma discharge 11 acts as a source of atomic hydrogen radicals. The plasma chamber 17 is adjacent to the opposing cold cathodes 12, and has a spacing 13 to prevent a discharge from occuring in the area beside the inner surface 14 of the opposing cold cathodes 12. A conventional Kaufman electron source is an alternative choice to the cold cathode glow discharge as an electron beam generator. A Kaufman electron source would provide for operation at a significantly lower gas pressure and, hence, could be more compatible with material processes requiring low ambient pressure operation such as ion implantation. Gas port 28 on the vacuum chamber 26 and the opening 19 provide a flow of hydrogen bearing gases for the plasma discharge 11 in the plasma chamber 17. A conventional cooling chamber 18 and coolant flow therein provide for heat removal from the opposing cold cathodes 12. The atomic hydrogen radicals produced in the plasma discharge 11 are ready for the reaction with the desired elemental species. A conventional d.c. or a.c. power supply 60 is connected between the opposing cold cathodes 12 and the vacuum chamber 26. In this manner, the applied electrical bias causes additional atomic and molecular hydrogen ion extraction from the plasma discharge 11. This is especially useful when operating at reduced pressures. A conventional d.c. or a.c. power supply 61 is connected between the opposing cold cathodes 12 and the plasma chamber 17 to create plasma discharge 11.

The vacuum chamber 26 contains the desired elemental species 21 in its reservoir 22 surrounded by a cooled jacket 27. Either a laser or lamp photon source or a soft-vacuum electron beam source 23 provides the heat required for evaporation of the desired elemental species. A conventional d.c., a.c., or pulsed power supply 24 drives the lamp, laser or electron beam. The evaporated desired species flow into the plasma discharge 11 through the opening 19. A polyatomic gas product 31 flows out through an exit 10, and is ready to be used for epitaxy, ion implantation, chemical vapor deposition and doping.

Figure 2:
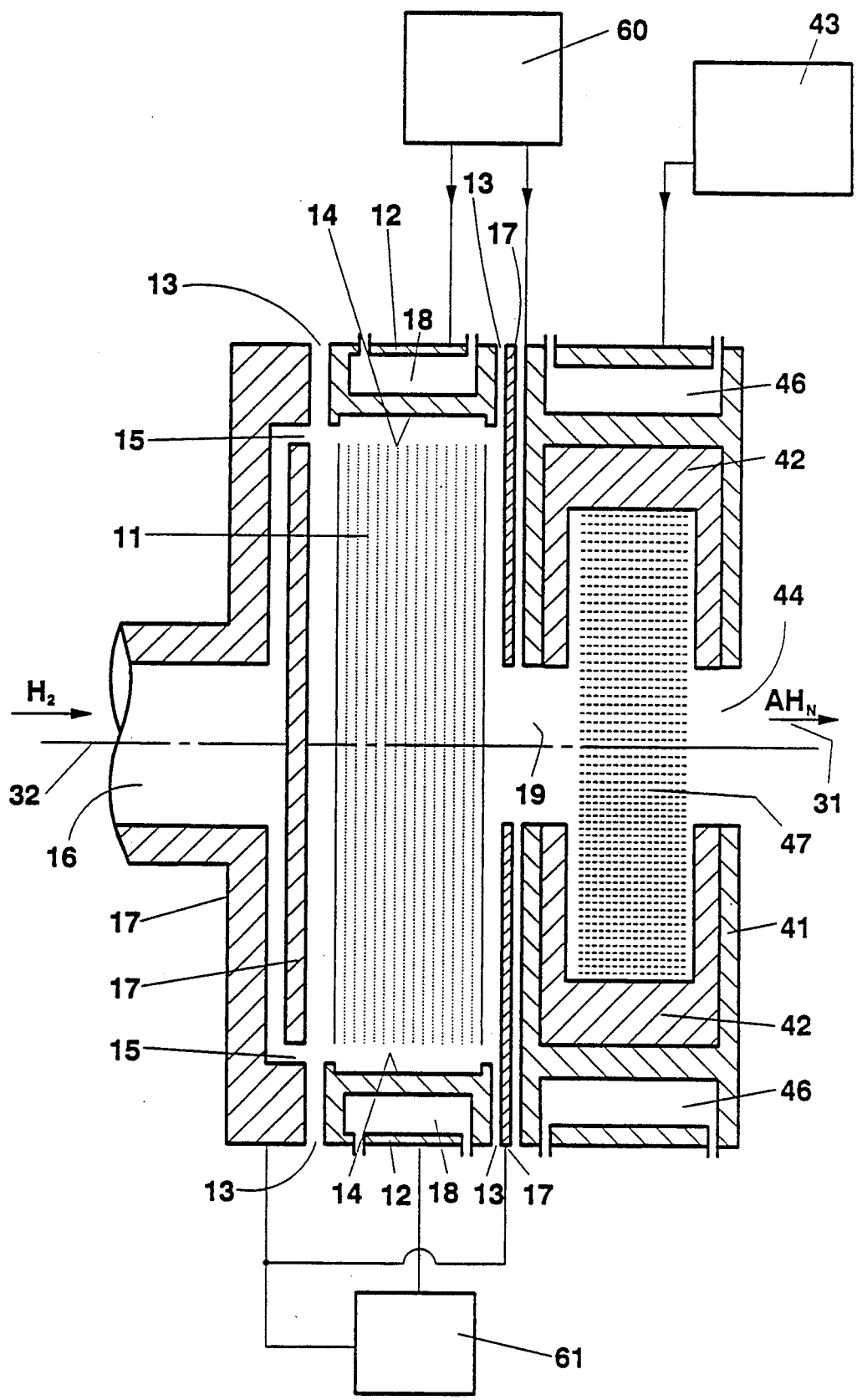
FIG. 2 (a) is cross-sectional representation of the two chamber apparatus for in-situ generation of dangerous polyatomic gases in accordance with the present invention, without the use of extraction grids between chambers, by using a discharge sputtering apparatus for creating the vapor of the desired species and a separate configuration for creating an atomic hydrogen plasma, where the direction of hydrogen bearing feedstock gas flux is from the plasma chamber toward the discharge sputtering chamber.
Figure 2:
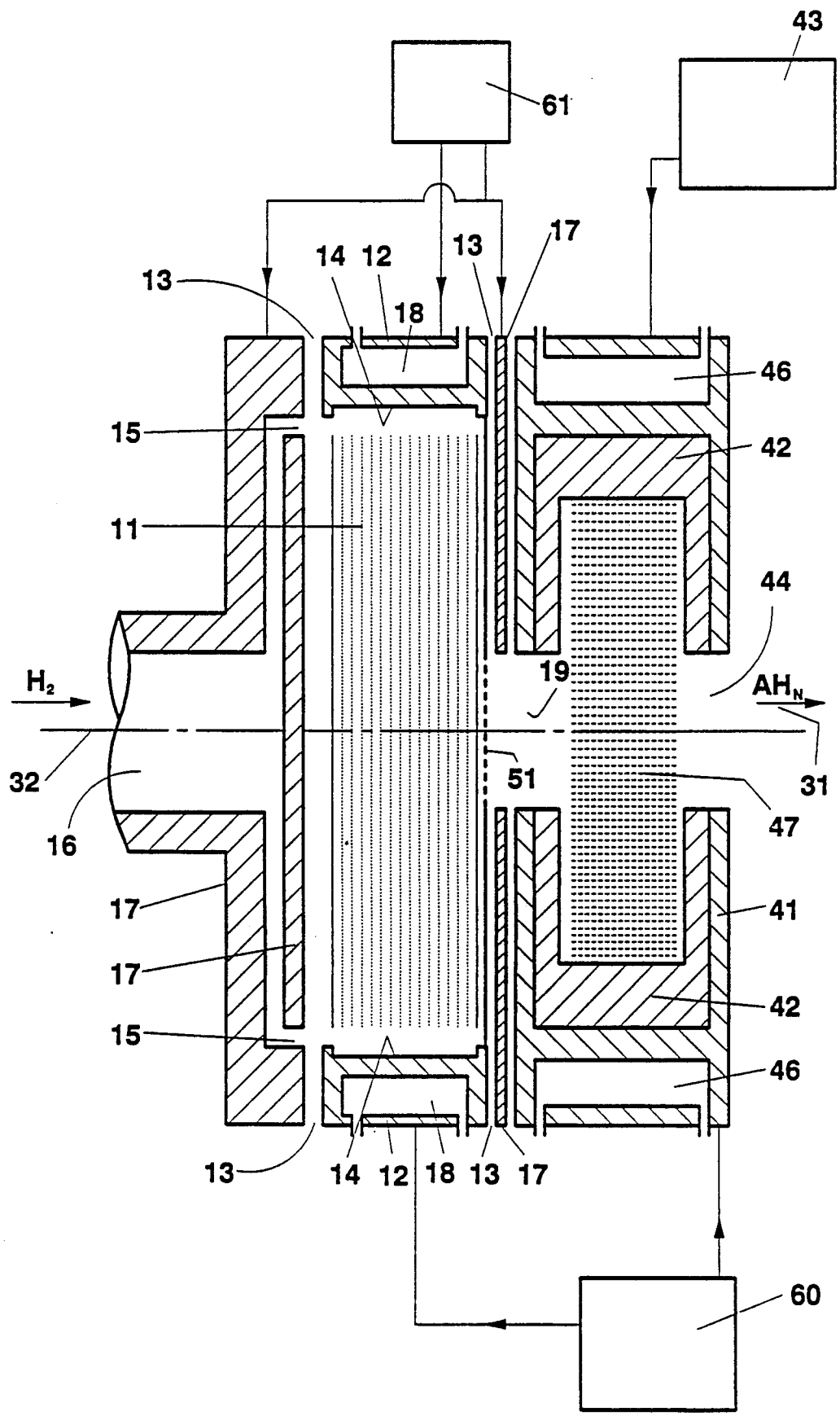
Figure 2:
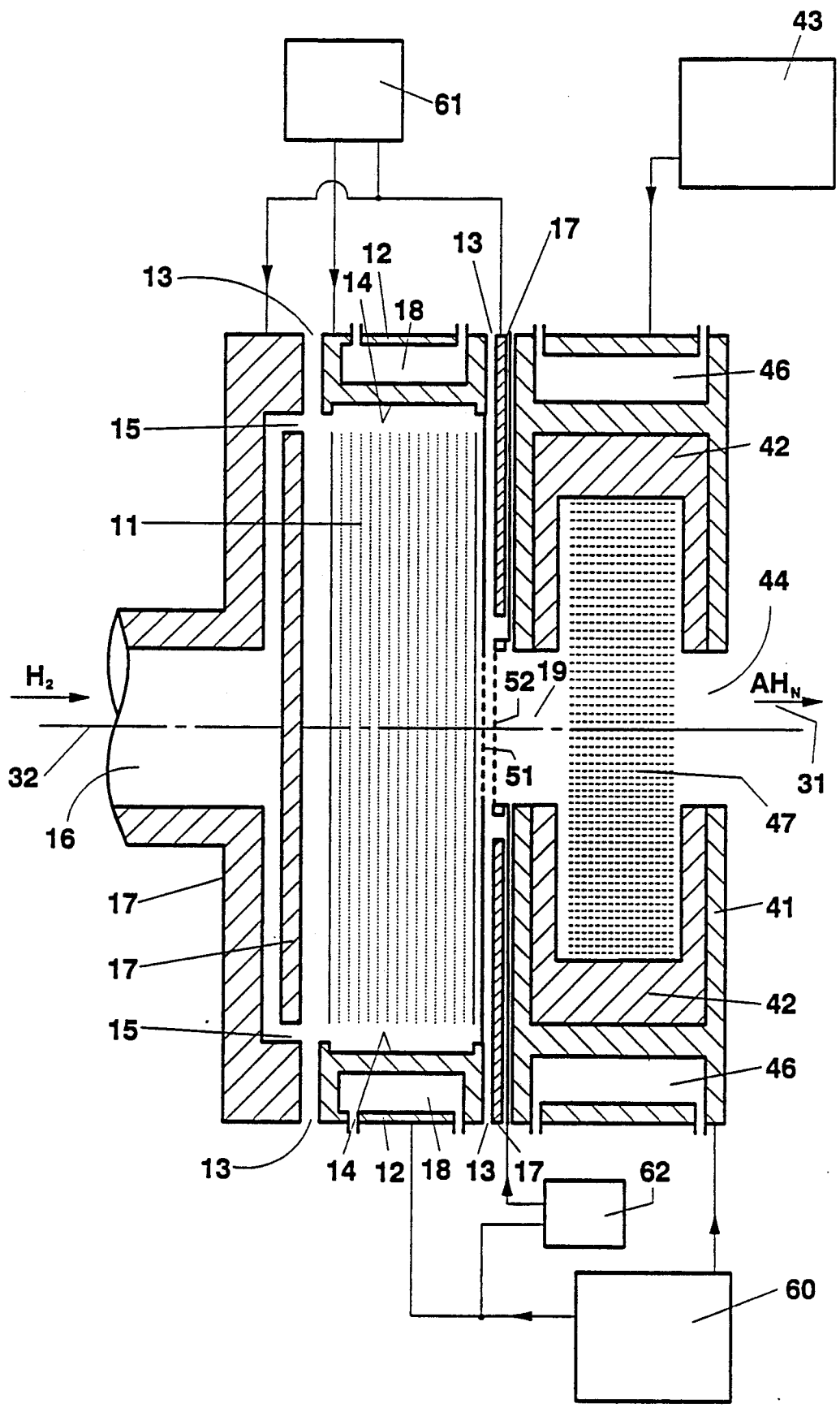
Figure 2:
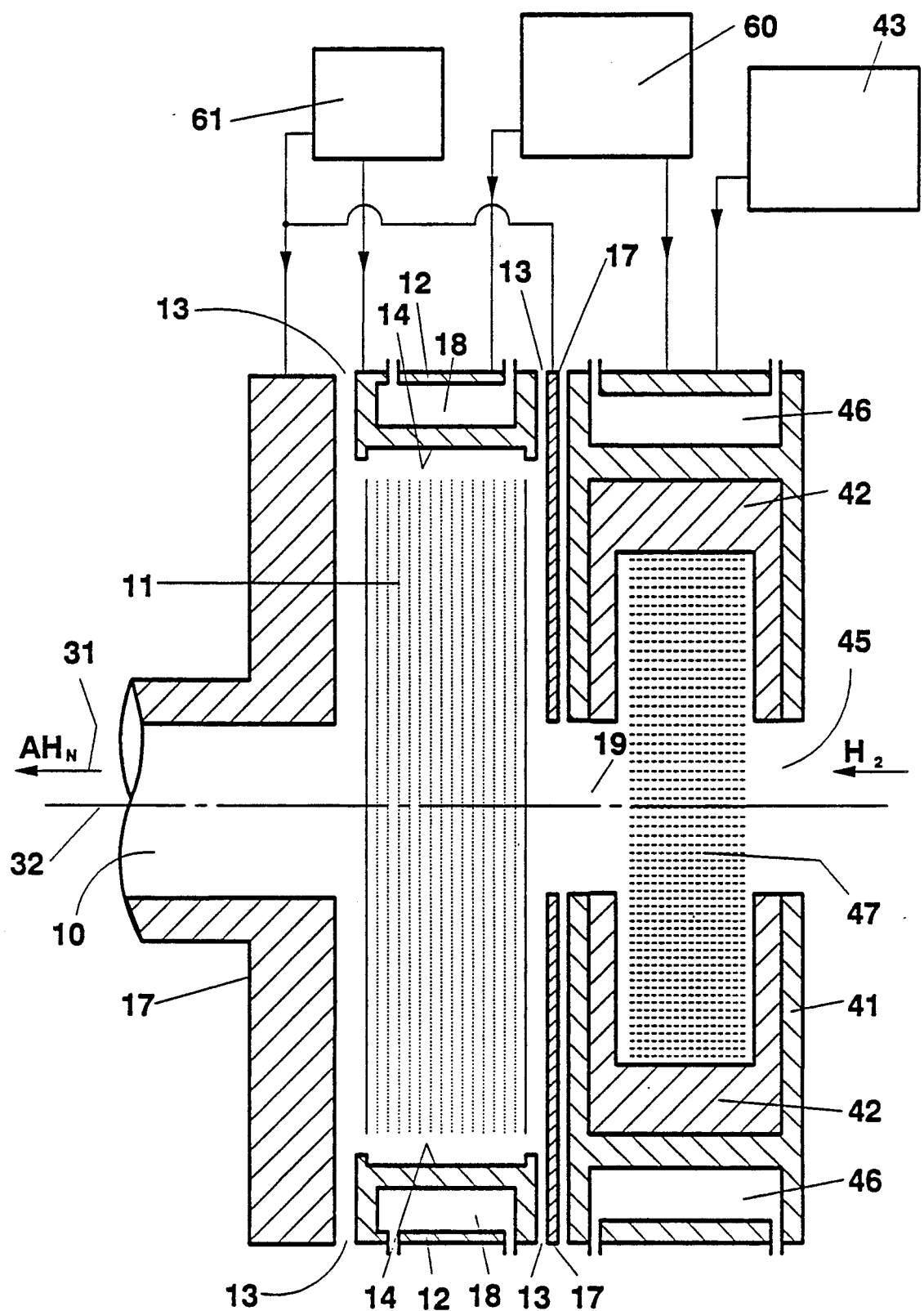

Referring now to FIG. 2 (a), there is shown a cross-sectional pictorial representation of a two-chamber apparatus for in-situ generation of dangerous polyatomic gases in accordance with the present invention. A plasma chamber 17 surrounds a pair of opposing cold cathodes 12 and a discharge sputtering chamber 41 contains an elemental species A incorporated as part of the target 42. An inner surface 14 of the opposing cold cathodes 12 emits secondary electrons in a beam form following ion bombardment, metastable impingement, or the absorption of a VUV photon. The secondary electrons are accelerated in the electric field, thus providing a plasma discharge 11. The opposing cold cathodes 12 act to contain energetic electrons by electrostatic reflection. In the preferred embodiment the grounded metal wall of the plasma chamber 17 is used as the discharge anode. The plasma discharge 11 excites the feedstock ambient gas via electron atom and electron-molecule collisions. For example, using molecular hydrogen or ammonia as the feedstock gas the plasma discharge 11 acts as a source of atomic hydrogen radicals. The plasma chamber 17 is adjacent to the opposing cold cathodes 12, and has a spacing 13 to prevent a discharge from occuring in the area beside the inner surface 14 of the opposing cold cathodes 12. A conventional Kaufman electron source is an alternative choice to the cold cathode glow discharge as an electron beam generator. A Kaufman electron source would provide for operation at a significantly lower gas pressure, and hence could be more compatible with material processes requiring low ambient pressure operation such as ion implantation. Gas port 16 and purging jets 15 provide a flow of hydrogen bearing gases for the plasma discharge 11 in the plasma chamber 17. A conventional cooling chamber 18 and coolant flow therein provide for heat removal from the opposing cold cathodes 12. The atomic hydrogen radicals produced in the plasma discharge 11 flow out through an opening 19 from the plasma chamber 17. A conventional d.c. or a.c. power supply 60 is connected between the opposing cold cathodes 12 and the discharge sputtering chamber 41. In this manner, the applied electrical bias causes additional atomic and molecular hydrogen ion extraction from the plasma discharge 11. This is especially useful when operating at reduced pressures. A conventional d.c. or a.c. power supply 61 is connected between the opposing cold cathodes 12 and the plasma chamber 17 to create plasma discharge 11.

The discharge sputtering chamber 41 includes opposing cathodes 42 which contain the material of desired elemental species A. A sputtering discharge 47 is forced between opposing cathodes 42. The two opposing cathodes 42 may be planar. Alternatively, the opposing cathodes 42 may be formed from a single cathode 42 of cylindrical or ring shape. In the preferred embodiment the grounded metal wall of the plasma chamber 17 is used as the discharge anode. The discharge sputtering chamber 41 can operate in a low pressure ($10^{-4}$ Torr to $10^{-2}$ Torr) magnetron mode, with application of an external magnetic field directed essentially parallel to the longitudinal axis 32. Alternatively, this apparatus can operate in a high pressure (greater than $10^{-2}$ Torr) discharge mode without an external magnetic field. Heat is removed from the opposing cathodes 42 by a conventional cooling chamber 46 and the flow of coolant therein. The discharge sputtering chamber 41 is powered by a conventional d.c., a.c., or pulsed power supply 43. The desired elemental species is either physically sputtered or thermally created in the discharge sputtering chamber 41 from opposing cathodes 42 and reacts with the atomic hydrogen radicals which come from either the plasma chamber 17 through the opening 19 or from atomic hydrogen generation in the discharge sputtering chamber 41 itself. That is, the discharge sputtering chamber 41 may generate the polyatomic species by itself via sputtering discharge 47 without the need of the opposing cold cathodes 12. However, the additional hydrogen radicals generated in the plasma discharge 11 will insure complete reaction and saturation of the radical species to form $AH_N$ or $A_2H_N$ stable forms. A polyatomic gas product 31 flows out through an exit 44, and is ready to be used for epitaxy, ion implantation, chemical vapor deposition and doping.

Referring now to FIG. 2 (b), there is shown a cross-sectional pictorial representation of a two-chamber apparatus for in-situ generation of dangerous polyatomic gases in accordance with the present invention. A plasma chamber 17 surrounds a pair of opposing cold cathodes 12 and a discharge sputtering chamber 41 contains an elemental species A incorporated as part of the target 42. An inner surface 14 of the opposing cold cathodes 12 emits secondary electrons in a beam form following ion bombardment, metastable impingement, or the absorption of a VUV photon. The secondary electrons are accelerated in the electric field, thus providing a plasma discharge 11. The opposing cold cathodes 12 act to contain energetic electrons by electrostatic reflection. In the preferred embodiment the grounded metal wall of the plasma chamber 17 is used as the discharge anode. The plasma discharge 11 excites the feedstock ambient gas via electron-atom and electron-molecule collisions. For example, using molecular hydrogen or ammonia as the feedstock gas the plasma discharge 11 acts as a source of atomic hydrogen radicals. The plasma chamber 17 is adjacent to the opposing cold cathodes 12, and has a spacing 13 to prevent a discharge from occuring in the area beside the inner surface 14 of the opposing cold cathodes 12. A conventional Kaufman electron source is an alternative choice to the cold cathode glow discharge as an electron beam generator. A Kaufman electron source would provide for operation at a significantly lower gas pressure and, hence, could be more compatible with material processes requiring low ambient pressure operation such as ion implantation. Gas port 16 and purging jets 15 provide a flow of hydrogen bearing gases for the plasma discharge 11 in the plasma chamber 17. A conventional cooling chamber 18 and coolant flow therein provide for heat removal from the opposing cold cathodes 12. The atomic hydrogen radicals produced in the plasma discharge 11 flow out through an opening 19 from the plasma chamber 17. A single extraction grid 51 on one open end of the opposing cold cathodes 12, covers the opening 19 to better extract the atomic and molecular hydrogen towards the discharge sputtering chamber 41. A conventional d.c. or a.c. power supply 60 is connected between the opposing cold cathodes 12 and the discharge sputtering chamber 41. In this manner, the applied electrical bias causes additional atomic and molecular hydrogen ion extraction from the plasma discharge 11. This is especially useful when operating at reduced pressures. A conventional d.c. or a.c. power supply 61 is connected between the opposing cold cathodes 12 and the plasma chamber 17 to create plasma discharge 11.

The discharge sputtering chamber 41 includes opposing cathodes 42 which contain the material of desired elemental species A. A sputtering discharge 47 is formed between opposing cathodes 42. The two opposing cathodes 42 may be planar. Alternatively, the opposing cathodes 42 may be formed from a single cathode 42 of cylindrical or ring shape. In the preferred embodiment, the grounded metal wall of the plasma chamber 17 is used as the discharge anode. The discharge sputtering chamber 41 can operate in a low pressure ($10^{-4}$ Torr to $10^{-2}$ Torr) magnetron mode, with application of an external magnetic field directed essentially parallel to the longitudinal axis 32. Alternatively, this apparatus can operate in a high pressure (greater than $10^{-2}$ Torr) discharge mode without an external magnetic field. Heat is removed from the opposing cathodes 42 by a conventional cooling chamber 46 and the flow of coolant therein. The discharge sputtering chamber 41 is powered by a conventional d.c., a.c., or pulsed power supply 43. The desired elemental species is either physically sputtered or thermally created in the discharge sputtering chamber 41 from opposing cathodes 42 and reacts with the atomic hydrogen radicals which come from either the plasma chamber 17 through the opening 19 or from atomic hydrogen generation in the discharge sputtering chamber 41 itself. That is, the discharge sputtering chamber 41 may generate the polyatomic species by itself via sputtering discharge 47 without the need of the opposing cold cathodes 12. However, the additional hydrogen radicals generated in the plasma discharge 11 will insure complete reaction and saturation of the radical species to form $AH_N$ or $A_2H_N$ stable forms. A polyatomic gas product 31 flows out through an exit 44, and is ready to be used for epitaxy, ion implantation, chemical vapor deposition and doping.

Referring now to FIG. 2 (c), there is shown a cross-sectional pictorial representation of a two-chamber apparatus for in-situ generation of dangerous polyatomic gases in accordance with the present invention. A plasma chamber 17 surrounds a pair of opposing cold cathodes 12 and a discharge sputtering chamber 41 contains an elemental species A incorporated as part of the target 42. An inner surface 14 of the opposing cold cathodes 12 emits secondary electrons in a beam form following ion bombardment, metastable impingement, or the absorption of a VUV photon. The secondary electrons are accelerated in the electric field, thus providing a plasma discharge 11. The opposing cold cathodes 12 act to contain energetic electrons by electrostatic reflection. In the preferred embodiment the grounded metal wall of the plasma chamber 17 is used as the discharge anode. The plasma discharge 11 excites the feedstock ambient gas via electron-atom and electron-molecule collisions. For example, using molecular hydrogen or ammonia as the feedstock gas the plasma discharge 11 acts as a source of atomic hydrogen radicals. The plasma chamber 17 is adjacent to the opposing cold cathodes 12, and has a spacing 13 to prevent a discharge from occuring in the area beside the inner surface 14 of the opposing cold cathodes 12. A conventional Kaufman electron source is an alternative choice to the cold cathode glow discharge as an electron beam generator. A Kaufman electron source would provide for operation at a significantly lower gas pressure and, hence, could be more compatible with material processes requiring low ambient pressure operation such as ion implantation. Gas port 16 and purging jets 15 provide a flow of hydrogen bearing gases for the plasma discharge 11 in the plasma chamber 17. A conventional cooling chamber 18 and coolant flow therein provide for heat removal from the opposing cold cathodes 12. The atomic hydrogen radicals produced in the plasma discharge 11 flow out through an opening 19 from the plasma chamber 17. Dual extraction grids 51 and 52 on one open end of the opposing cold cathodes 12, cover the opening 19 to better extract the atomic and molecular hydrogen towards the discharge sputtering chamber 41. Grid 51 is connected to the opposing cold cathodes 12. Grid 52 is connected to a conventional d.c. or a.c. power supply 62. A conventional d.c. or a.c. power supply 60 is connected between the opposing cold cathodes 12 and the discharge sputtering chamber 41. In this manner, the applied electrical bias causes additional atomic and molecular hydrogen ion extraction from the plasma discharge 11. This is especially useful when operating at reduced pressures. A conventional d.c. or a.c. power supply 61 is connected between the opposing cold cathodes 12 and the plasma chamber 17 to create plasma discharge 11.

The discharge sputtering chamber 41 includes opposing cathodes 42 which contain the material of desired elemental species A. A sputtering discharge 47 is formed between opposing cathodes 42. The two opposing cathodes 42 may be planar. Alternatively, the opposing cathodes 42 may be formed from a single cathode 42 of cylindrical or ring shape. In the preferred embodiment, the grounded metal wall of the plasma chamber 17 is used as the discharge anode. The discharge sputtering chamber 41 can operate in a low pressure ($10^{-4}$ Torr to $10^{-2}$ Torr) magnetron mode, with application of an external magnetic field directed essentially parallel to the longitudinal axis 32. Alternatively, this apparatus can operate in a high pressure (greater than $10^2$ Torr) discharge mode without an external magnetic field. Heat is removed from the opposing cathodes 42 by a conventional cooling chamber 46 and the flow of coolant therein. The discharge sputtering chamber 41 is powered by a conventional d.c., a.c., or pulsed power supply 43. The desired elemental species is either physically sputtered or thermally created in the discharge sputtering chamber 41 from opposing cathodes 42 and reacts with the atomic hydrogen radicals which come from either the plasma chamber 17 through the opening 19 or from atomic hydrogen generation in the discharge sputtering chamber 41 itself. That is, the discharge sputtering chamber 41 may generate the polyatomic species by itself via sputtering discharge 47 without the need of the opposing cold cathodes 12. However, the additional hydrogen radicals generated in the plasma discharge 11 will insure complete reaction and saturation of the radical species to form $AH_N$ or $A_2H_N$ stable forms. A polyatomic gas product 31 flows out through an exit 44, and is ready to be used for epitaxy, ion implantation, chemical vapor deposition and doping.

Referring now to FIG. 2 (d), there is shown a cross-sectional pictorial representation of a two-chamber apparatus for in-situ generation of dangerous polyatomic gases in accordance with the present invention. The apparatus shown in FIG. 2 (d) is the same as that shown in FIG. 2 (a) except that the flow of gases is in the opposite direction. A plasma chamber 17 surrounds a pair of opposing cold cathodes 12 and a discharge sputtering chamber 41 contains an elemental species A incorporated as part of the target 42. An inner surface 14 of the opposing cold cathodes 12 emits secondary electrons in a beam form following ion bombardment, metastable impingement, or the absorption of a VUV photon. The secondary electrons are accelerated in the electric field, thus providing a plasma discharge 11. The opposing cold cathodes 12 act to contain energetic electrons by electrostatic reflection. In the preferred embodiment, the grounded metal wall of the plasma chamber 17 is used as the discharge anode. The plasma discharge 11 excites the feedstock ambient gas via electron-atom and electron-molecule collisions. For example, using molecular hydrogen or ammonia as the feedstock gas the plasma discharge 11 acts as a source of atomic hydrogen radicals. The plasma chamber 17 is adjacent to the opposing cold cathodes 12, and has a spacing 13 to prevent a discharge from occuring in the area beside the inner surface 14 of the opposing cold cathodes 12. A conventional Kaufman electron source is an alternative choice to the cold cathode glow discharge as an electron beam generator. A Kaufman electron source would provide for operation at a significantly lower gas pressure and, hence, could be more compatible with material processes requiring low ambient pressure operation such as ion implantation. Gas port 45 on the discharge sputtering chamber 41 and the opening 19 provide a flow of hydrogen bearing gases for the plasma discharge 11 in the plasma chamber 17. A conventional cooling chamber 18 and coolant flow therein provide for heat removal from the opposing cold cathodes 12. The atomic hydrogen radicals produced in the plasma discharge 11 are ready for the reaction with the desired elemental species. A conventional d.c. or a.c. power supply 60 is connected between the opposing cold cathodes 12 and the discharge sputtering chamber 41. In this manner, the applied electrical bias causes additional atomic and molecular hydrogen ion extraction from the plasma discharge 11. This is especially useful when operating at reduced pressures. A conventional d.c. or a.c. power supply 61 is connected between the opposing cold cathodes 12 and the plasma chamber 17 to create plasma discharge 11.

The discharge sputtering chamber 41 includes opposing cathodes 42 which contain the material of desired elemental species A. A sputtering discharge 47 is formed between opposing cathodes 42. The two opposing cathodes 42 may be planar. Alternatively, the opposing cathodes 42 may be formed from a single cathode 42 of cylindrical or ring shape. In the preferred embodiment, the grounded metal wall of the plasma chamber 17 is used as the discharge anode. The discharge sputtering chamber 41 can operate in a low pressure ($10^{-4}$ Torr to $10^{-2}$ Torr) magnetron mode, with application of an external magnetic field directed essentially parallel to the longitudinal axis 32. Alternatively, this apparatus can operate in a high pressure (greater than $10^{-2}$ Torr) discharge mode without an external magnetic field. Heat is removed from the opposing cathodes 42 by a conventional cooling chamber 46 and the flow of coolant therein. The discharge sputtering chamber 41 is powered by a conventional d.c., a.c., or pulsed power supply 43. The desired elemental species is either physically sputtered or thermally created in the discharge sputtering chamber 41 from opposing cathodes 42 and reacts with the atomic hydrogen radicals which come from either the plasma chamber 17 through the opening 19 or from atomic hydrogen generation in the discharge sputtering chamber 41 itself. That is, the discharge sputtering chamber 41 may generate the polyatomic species by itself via sputtering discharge 47 without the need of the opposing cold cathodes 12. However, the additional hydrogen radicals generated in the plasma discharge 11 will insure complete reaction and saturation of the radical species to form $AH_N$ or $A_2H_N$ stable forms. A polyatomic gas product 31 flows out through an exit 10, and is ready to be used for epitaxy, ion implantation, chemical vapor deposition and doping.

Figure 3:
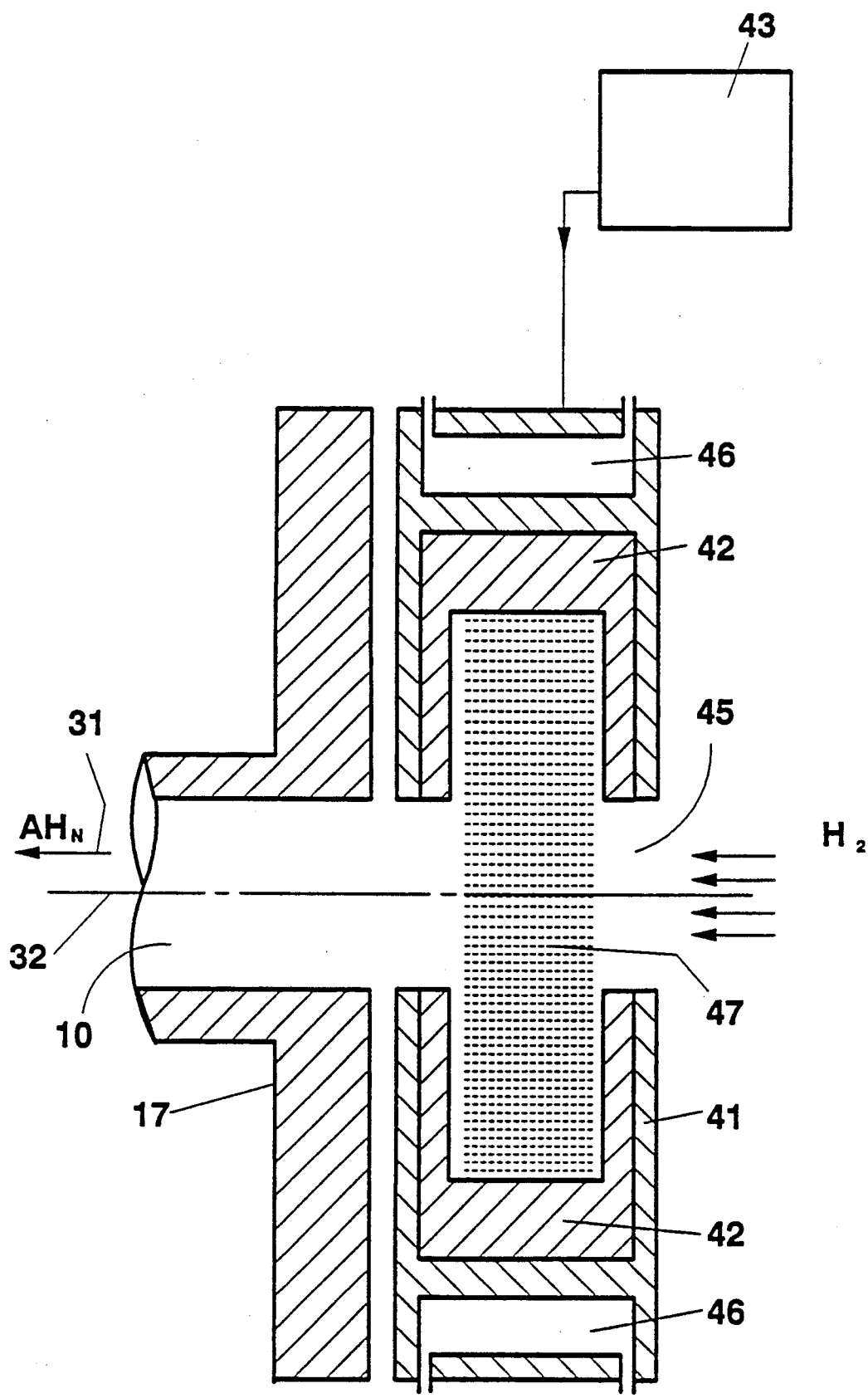
FIG. 3 is a cross-sectional representation of the single chamber apparatus for in-situ generation of dangerous polyatoxic gases in accordance with the present invention by using a single gas discharge sputtering apparatus for creation of both the atomic hydrogen and the vapor of the desired elemental species.

Referring now to FIG. 3, there is shown a cross-sectional pictorial representation of a single chamber apparatus employed for in-situ generation of dangerous polyatomic gases in accordance with the present invention. The apparatus can operate in a low pressure ($10^{-4}$ Torr to $10^{-2}$ Torr) magnetron mode, with application of an external magnetic field directed essentially parallel to a longitudinal axis 32. Alternatively, the apparatus can operate in a high pressure (pressure greater than $10^{-2}$ Torr) discharge mode without an external magnetic field. A discharge is formed between opposing cold cathodes 42. The two opposing cold cathodes 42 may be planar. Alternatively, the opposing surfaces may be formed from a single cold cathode 42 of cylindrical or ring shape. In the prefered embodiment, the grounded metal wall 17 is used as the discharge anode. The opposing cathodes 42 contain the desired elemental species A. A series of tandem cold cathodes, each containing different elemental species, or a single multi-component cathode may be used for multi-component gas generation. A conventional cooling chamber 46 and coolant flow therein provide for heat removal from opposing cold cathodes 42. This single chamber apparatus is powered by a conventional d.c., a.c., r.f., microwave, or pulsed power supply 43. The desired elemental species is either physically sputtered or thermally created from the opposing cold cathodes 42. Gas port 45 provides a flow of hydrogen bearing gases for plasma discharge 47 located in the discharge chamber 41. In plasma discharge 47, the dissociation of the hydrogen bearing feedstock gas occurs. The elemental species evolved from cold cathode 42 react with the atomic hydrogen radicals created in the discharge chamber 41 via plasma discharge 47. That is, the apparatus may generate the desired polyatomic species entirely on its own. The polyatomic gas product 31 flows out through a exit 10, and is ready to be used for epitaxy, ion implantation, chemical vapor deposition and doping.

Figure 4:
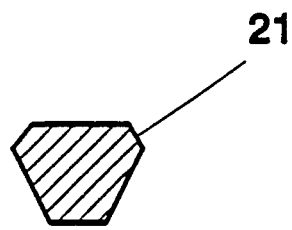
FIG. 4 (a) is a cross-sectional representation of a self-contained foamed material structure whose pores act as reservoirs of material containing a desired elemental species A for in-situ generation of dangerous polyatomic gases in accordance with the present invention, in which a vapor containing the desired elemental species A is generated in the vacuum chamber by using resistive, r.f., electron beam, ion beam, or photon beam heating mechanisms.
Figure 4:
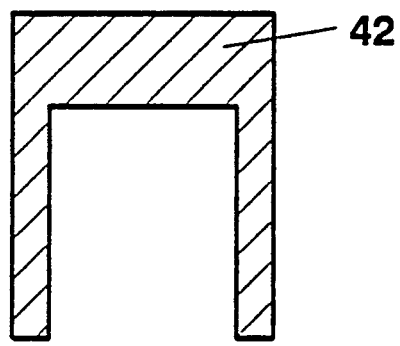
Figure 4:
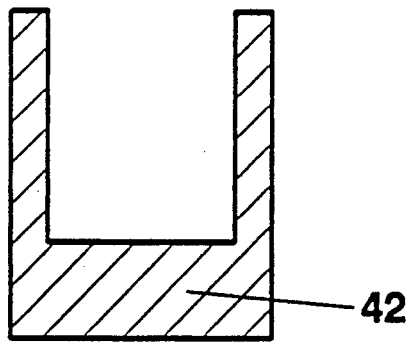
Figure 4:
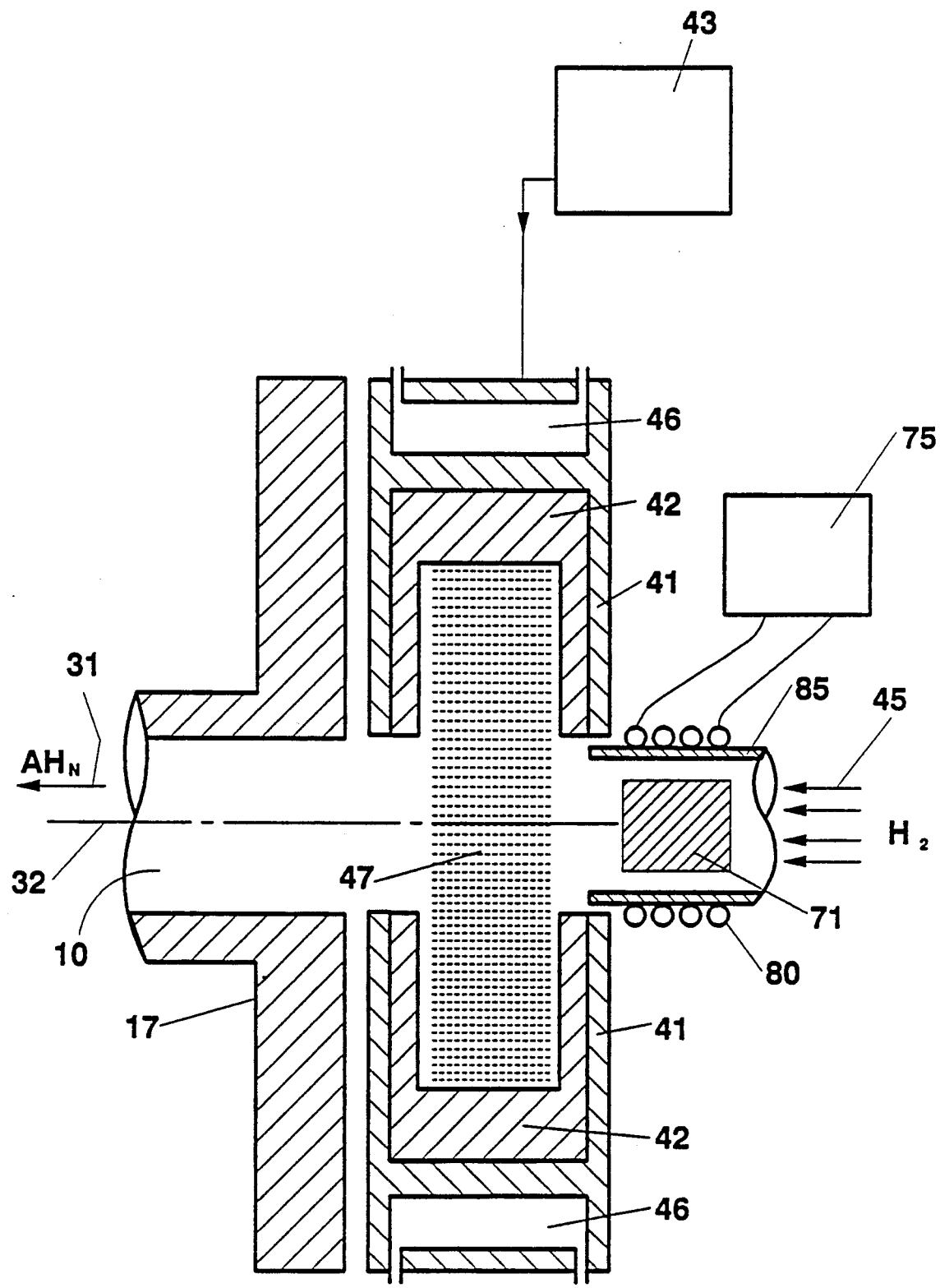
Figure 4:
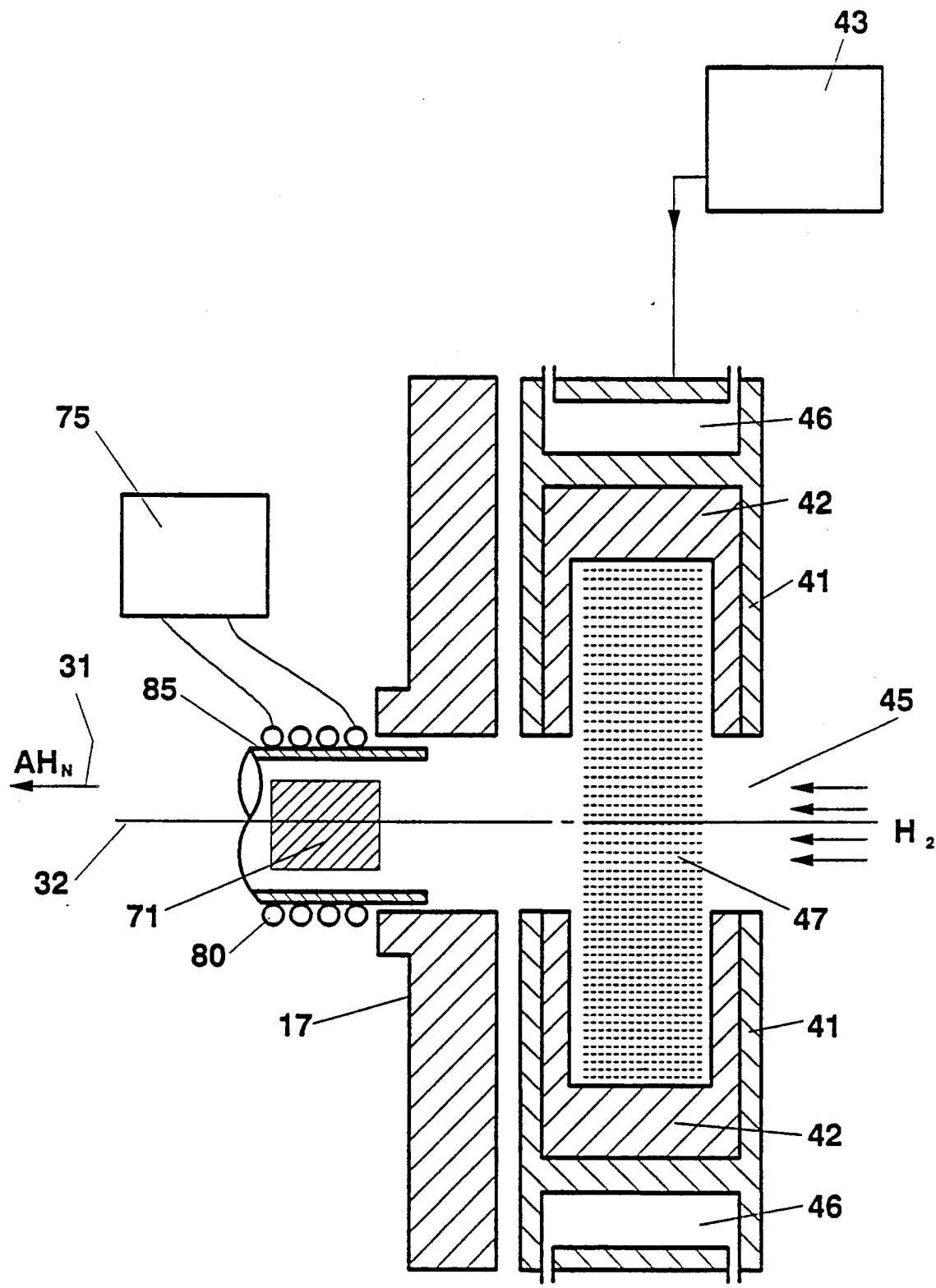
Figure 4:
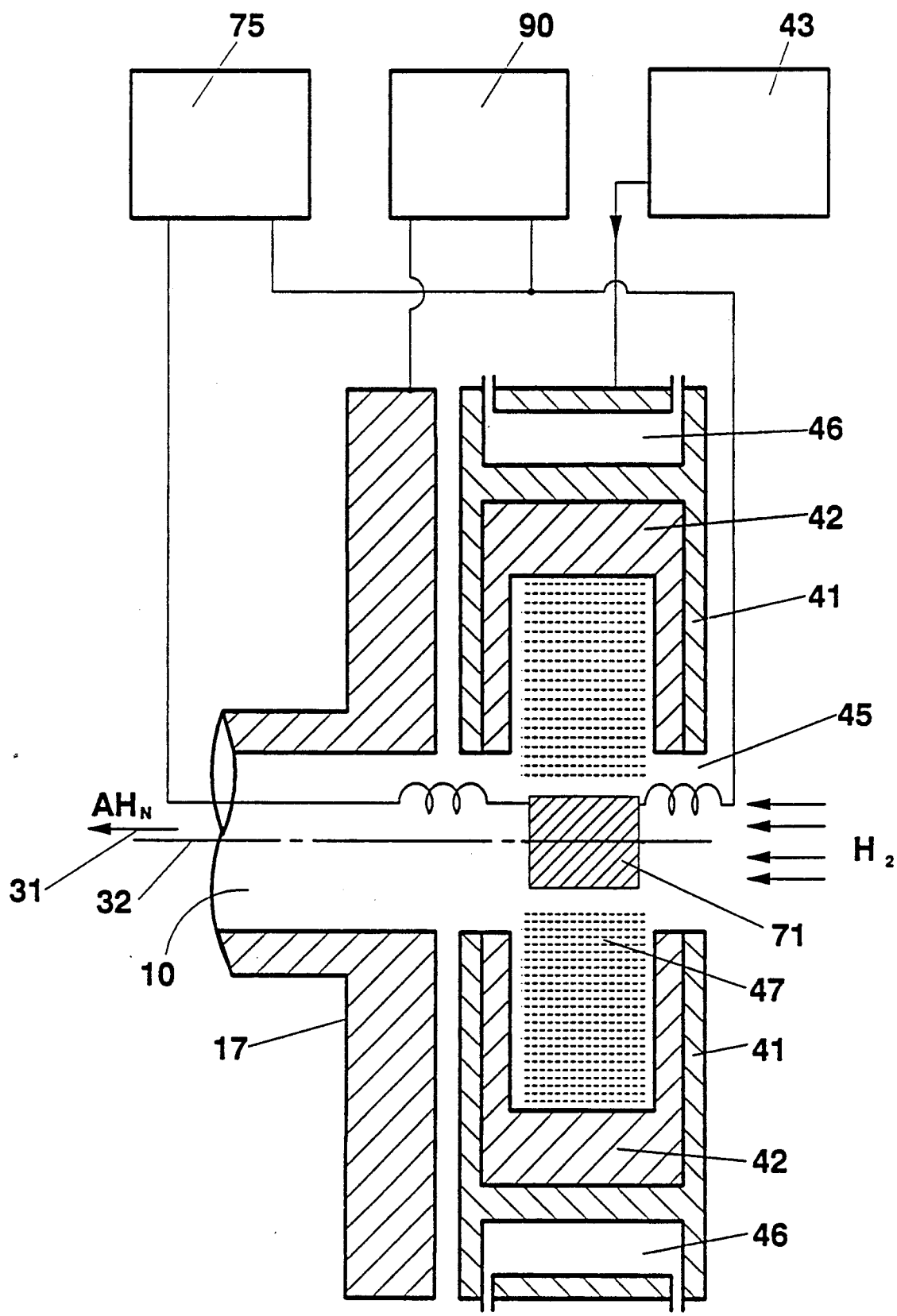

Referring now to FIG. 4 (a), there is shown a cross-sectional pictoral representation of a self-contained foamed material structure 21. The foamed material structure 21 contains the desired elemental species A in its pores. Typically, the foamed material structure 21 is a refractory metal, such as tungsten or tantalum, or it is a porous ceramic material or porous glass material. Care must be exercised in selecting the foamed material, to insure that there is no chemical reaction between the foamed material structure 21 and the material having the desired elemental species A. The material having the desired elemental species A, having been previously melted and absorbed into the foamed material structure 21, is subsequently released in vapor form from the surface of the foamed material structure 21 upon being heated. Heating can be accomplished using standard techniques, such as resistive heating or r.f. heating mechanisms, or ion, electron or photon beam impingement can be used for heating. In the configuration illustrated in FIG. 4 (a), heating would occur by photon, electron, or ion beam impingement, as illustrated in FIGS. 1 (a) through 1 (d), the foamed material structure 21 would be placed, for example, in the reservoir 22 of the apparatus of FIG. 1 (a) through FIG. 1 (d). The foamed material structure 21 provides a wicking mechanism for the material having the desired elemental species, by replenishing the material which is released at the surface of the foamed material structure 21 with material from within the foamed material structure 21. In this manner, the foamed material structure 21 provides a convenient reservoir for the desired elemental species. The arrangement is rugged, can be oriented in geometries without regard to gravity, and is long lived, as large amounts of the desired elemental species can be incorporated into the foamed material structure 21. It is especially convenient for species which are in liquid form at the temperature required for vapor generation. The vapor of the desired species A then reacts with the atomic hydrogen radicals generated by a plasma to form a volatile polyatomic gas. A combination of several formed material structures, each with an elemental species can be used for simultaneous generation of several polyatomic gasses. Similarly, a single foamed material structure can be used to contain more than one desired elemental species, and this can be used to simultaneously generate several polyatomic gasses.

Referring now to FIG. 4 (b), there is shown a cross-sectional pictoral representation of a self-contained foamed material structure. The foamed material structure 42 contains material having the desired elemental species A in its pores. Typically, the foamed material structure 42 is a refractory metal, such as tungsten or tantalum, or it is a porous ceramic material or porous glass material. Care must be exercised in selecting the foamed material, to insure that there is no chemical reaction between the foamed material structure 42 and a substance having the desired elemental species A. The substance having the desired elemental species A, having been previously melted and absorbed into the foamed material structure 42, is subsequently released in vapor form from the surface of the foamed material structure 42 upon being heated. Heating can be accomplished using standard techniques, such as resistive heating or r.f. heating mechanisms, or ion, electron or photon beam impingement can be used for heating. In the configuration illustrated in FIG. 4 (b), the foamed material structure 42 would form the portion of the opposing cathodes 42 of the apparatus illustrated in FIGS. 2 (a) through 2 (d) as well as FIG. 3, which are exposed to the plasma. The desired elemental species is either physically sputtered or thermally created in the gas discharge apparatus. The foamed material structure 42 provides a wicking mechanism for the substance having the desired elemental species, by replenishing the substance which is released at the surface of the structure with the substance from within the foamed material structure 42. In this manner, the foamed material structure 42 provides a convenient reservoir for the desired elemental species. The arrangement is rugged, can be oriented in geometries without regard to gravity, and it is long lived, as large amounts of the desired elemental species can be incorporated into the foamed material structure 42. It is especially convenient for species which are in liquid form at the temperature required for vapor generation. The vapor of the desired species A then reacts with the atomic hydrogen radicals generated by a plasma to form a volatile polyatomic gas. A combination of several foamed material structures, each with an elemental species can be used for simultaneous generation of several polyatomic gases. Similarly, a single foamed material structure can be used to contain more than one desired elemental species, and this can be used to simultaneously generate several polyatomic gases.

Referring now to FIG. 4 (c), there is shown a cross-sectional pictoral representation of a self-contained foamed material structure as it would be employed within the single chamber apparatus for in-situ generation of dangerous polyatomic gases in accordance with the present invention. The apparatus can operate in a low pressure ($10^{-4}$ Torr to $10^{-2}$ Torr) magnetron mode, with application of an external magnetic field directed essentially parallel to the longitudinal axis 32. Alternatively, the apparatus can operate in a high pressure (pressure greater than $10^{-2}$ Torr) discharge mode without an external magnetic field. A discharge is formed between opposing cathodes 42. The two opposing cathodes 42 could be planar. Alternatively, the opposing surfaces could be formed from a single cathode 42 of cylindrical or ring shape. In the preferred embodiment, the grounded metal wall 17 is used as the discharge anode. The foamed material structure 71 contains a substance having the desired elemental species, A in its pores. Typically, the foamed material structure is a refractory metal, such as tungsten or tantalum, or it is a porous ceramic material or porous glass material. Care must be exercised in selecting the foamed substance, to insure that there is no chemical reaction between the foamed material structure and the substance having the desired elemental species A. The substance having the desired elemental species A, having been previously melted and absorbed into the foamed material structure, is subsequently released in vapor form from the surface of the foamed material structure upon being heated. Heating can be accomplished using standard techniques, such as resistive heating, r.f., microwave, or pulsed energy supplied from a means exterior to the vacuum apparatus. For illustrative purposes, FIG. 4 (c) illustrates the heating provided by r.f. energy supplied from a means exterior to the apparatus consisting of a conventional r.f. power supply 75 connected to coils 80 which act to couple the r.f. energy to the foamed material structure 71, through the tube 85 constructed of an electrically insulating material. The desired elemental species is thereby thermally created in the vacuum apparatus. The foamed material structure provides a wicking mechanism for the substance having the desired elemental species, by replenishing the substance which is released at surface of the foamed material structure with substance from within the interior of the foamed material structure. In this manner, the foamed material structure provides a convenient reservoir for the desired elemental species. The arrangement is rugged, can be oriented in geometries without regard to gravity, and it is long lived, as large amounts of the desired elemental species can be incorporated into the foamed material structure. It is especially convenient for species which are in liquid form at the temperature required for vapor generation. A conventional cooling chamber 46 and coolant flow therein provide for heat removal from opposing cathodes 42. The vapor of the desired species A then reacts with the atomic hydrogen radicals generated in the gas discharge 47 to form a volatile polyatomic gas 31 which flows out through the exit 10 and is ready to be used for epitaxy, ion implantation, chemical vapor deposition and doping. The gas discharge 47 is powered by a conventional d.c., a.c., r.f., microwave, or pulsed power supply 43. A combination of several foamed material structures, each containing an elemental species in its pores, can be used for simultaneous generation of several polyatomic gases. Similarly, a single foamed material structure can be used to contain more than one desired elemental species in its pores, and this can be used to simultaneously generate several polyatomic gasses.

Referring now to FIG. 4 (d), there is shown a cross-sectional pictoral representation of a foamed material structure as it would be employed within the single chamber apparatus for in-situ generation of dangerous polyatomic gases in accordance with the present invention. The apparatus can operate in a low pressure ($10^{-4}$ Torr to $10^{-2}$ Torr) magnetron mode, with application of an external magnetic field directed essentially parallel to the longitudinal axis 32. Alternatively, the apparatus can operate in a high pressure (pressure greater than $10^{-2}$ Torr) discharge mode without an external magnetic field. A discharge is formed between opposing cathodes 42. The two opposing cathodes 42 could be planar. Alternatively, the opposing surfaces could be formed from a single cathode 42 of cylindrical or ring shape. In the prefered embodiment, the grounded metal wall 17 is used as the discharge anode. The foamed material structure 71 contains a substance having the desired elemental species A in its pores. Typically, the foamed material structure is a refractory metal, such as tungsten or tantalum, or it is a porous ceramic material or a porous glass material. Care must be exercised in selecting the foamed material structure, to insure that there is no chemical reaction between the foamed material structure 71 and the substance having the desired elemental species A. The substance having the desired elemental species A, having been previously melted and absorbed into the foamed material structure, is subsequently released in vapor form from the surface of the foamed material structure 71 upon being heated. Heating can be accomplished using standard techniques, such as resistive heating, r.f., microwave, or pulsed energy supplied from a means exterior to the vacuum apparatus. For illustrative purposes, FIG. 4 (d) illustrates the heating provided by r.f. energy supplied from a means exterior to the apparatus consisting of a conventional r.f. power supply 75 connected to coils 80 which act to couple the r.f. energy to the foamed material structure 71, through the tube 85 constructed of insulating material. The desired elemental species is thereby thermally created in the vacuum apparatus. The foamed material structure 71 provides a wicking mechanism for the material having the desired elemental species, by replenishing the substance which is released at the surface of the foamed material structure 71 with the substance from within the interior of the foamed material structure 71. In this manner, the foamed material structure 71 provides a convenient reservoir for the desired elemental species. The arrangement is rugged, can be oriented in geometries without regard to gravity, and it is long lived, as large amounts of the desired elemental species can be incorporated into the foamed material structure 71. It is especially convenient for species which are in liquid form at the temperature required for vapor generation. A conventional cooling chamber 46 and coolant flow therein provide for heat removal from cold cathode 42. The vapor of the desired species A then reacts with the atomic hydrogen radicals generated in the gas discharge 47 to form a volatile polyatomic gas 31 which flows out through the exit 10 and is ready to be used for epitaxy, ion implantation, chemical vapor deposition and doping. The gas discharge 47 is powered by a conventional d.c., a.c., r.f., microwave, or pulsed power supply 43. A combination of several foamed material structures 71, each containing an elemental species in its pores and this can be used for simultaneous generation of several polyatomic gasses. Similarly, a single foamed material structure 71 can be used to contain more than one desired elemental species, and this can be used to simultaneously generate several polyatomic gasses.

Referring now to FIG. 4 (e), there is shown a cross-sectional pictoral representation of a foamed material structure as it would be employed within the single chamber apparatus for in-situ generation of dangerous polyatomic gases in accordance with the present invention. The apparatus can operate in a low pressure ($10^{-4}$ Torr to $10^{-2}$ Torr) magnetron mode, with application of an external magnetic field directed essentially parallel to the longitudinal axis 32. Alternatively, the apparatus can operate in a high pressure (pressure greater than $10^{-2}$ Torr) discharge mode without an external magnetic field. A discharge is formed between opposing cathodes 42. The two opposing cathodes 42 could be planar. Alternatively, the opposing surfaces could be formed from a single cathode 42 of cylindrical or ring shape. In the prefered embodiment, the grounded metal wall 17 is used as the discharge anode. The foamed material structure 71 contains a substance having the desired elemental species A in its pores. Typically, the foamed material structure is a refractory metal, such as tungsten or tantalum, or it is a porous ceramic material or a porous glass material or a porous glass material. Care must be exercised in selecting the foamed material structure, to insure that there is no chemical reaction between the foamed material structure 71 and the substance having the desired elemental species A. The substance having the desired elemental species A, having been previously melted and absorbed into the foamed material structure, is subsequently released in vapor form from the surface of the foamed material structure 71 upon being heated. Heating can be accomplished using energy from the discharge, in addition to standard techniques, such as resistive heating, r.f., microwave, or pulsed energy supplied from a means exterior to the vacuum apparatus. For illustrative purposes, FIG. 4 (e) illustrates the arrangement for resistive heating supplied from a means exterior to the apparatus consisting of a conventional power supply 75 connected to the foamed material structure 71. Note that the foamed material structure 71 is not required to be at a specific electric potential. A conventional d.c. or a.c. power supply 90 is used to provide an electrical bias to the foamed structure 71, thereby controlling the nature and amount of particle bombardment and, hence, the contribution of the discharge to the heating mechanism of the foamed structure 71. The desired elemental species is thereby thermally created in the vacuum apparatus. The foamed material structure 71 provides a wicking mechanism for the material having the desired elemental species, by replenishing the substance which is released at the surface of the foamed material structure 71 with the substance from within the interior of the foamed material structure 71. In this manner, the foamed material structure 71 provides a convenient reservoir for the desired elemental species. The arrangement is rugged, can be oriented in geometries without regard to gravity, and it is long lived, as large amounts of the desired elemental species can be incorporated into the foamed material structure 71. It is especially convenient for species which are in liquid form at the temperature required for vapor generation. A conventional cooling chamber 46 and coolant flow therein provide for heat removal from cold cathode 42. The vapor of the desired species A then reacts with the atomic hydrogen radicals generated in the gas discharge 47 to form a volatile polyatomic gas 31 which flows out through the exit 10 and is ready to be used for epitaxy, ion implantation, chemical vapor deposition and doping. The gas discharge 47 is powered by a conventional d.c., a.c., r.f., microwave, or pulsed power supply 43. A combination of several foamed material structures 71, each containing an elemental species in its pores and this can be used for simultaneous generation of several polyatomic gasses. Similarly, a single foamed material structure 71 can be used to contain more than one desired elemental species, and this can be used to simultaneously generate several polyatomic gasses.

We claim:

1. A single-chamber apparatus for in-situ generation of dangerous polyatomic gases and radicals, for removal from and subsequent use outside the apparatus, the apparatus comprising:

a discharge chamber having a feedstock gas entry port for admitting one or more feedstock gases into the discharge chamber and an exit port for removing the generated dangerous polyatomic gases and radicals from the discharge chamber, the discharge chamber containing a cooled cathode for providing a plasma discharge within the discharge chamber;

tubular means positioned outside the discharge chamber and coupled to a selected one of said feedstock gas entry port and exit port, said tubular means containing a porous foamed structure having a source material in pores thereof;

heating means coupled adjacent the tubular means for controllably heating the porous foamed structure to maintain it within a fixed temperature range, the fixed temperature range being specifically chosen such that the source material is removed from the porous foamed structure by evaporation induced by heat from said heating means while at the same time preventing consumption by evaporation of the porous foamed structure itself; and power supply means for applying electrical potentials to the cooled cathode and to the heating means.

2. A single-chamber apparatus for in-situ generation of dangerous polyatomic gases and radicals as in claim 1 wherein the source material comprises an elemental solid.

3. A single-chamber apparatus for in-situ generation of dangerous polyatomic gases and radicals as the claim 1 wherein the source material comprises an elemental liquid.

4. A single-chamber apparatus for in-situ generation of dangerous polyatomic gases and radicals as in claim 1 wherein the source material comprises a compound liquid containing a desired elemental species.

5. A single-chamber apparatus for in-situ generation of dangerous polyatomic gases and radicals as in claim 1 wherein the source comprises a compound solid containing a desired elemental species.

6. A single-chamber apparatus for in-situ generation of dangerous polyatomic gases and radicals as in claim 1 wherein the porous foamed structure comprises a porous foamed metal containing the source material in pores thereof.

7. A single-chamber apparatus for in-situ generation of dangerous polyatomic gases and radicals as in claim 1 wherein the porous foamed structure comprises a porous foamed metal alloy containing the source material in pores thereof.

8. A single-chamber apparatus for in-situ generation of dangerous polyatomic gases and radicals as in claim 59 wherein the porous foamed structure comprises a porous foamed ceramic material containing the source material in pores thereof.

9. A single-chamber apparatus for in-situ generation of dangerous polyatomic gases and radicals as in claim 1 wherein the porous foamed structure comprises a porous foamed glass material containing the source material in pores thereof.

10. A single-chamber apparatus for in-situ generation of dangerous polyatomic gases and radicals as in claim 1 wherein the heating means comprises a radio frequency heating source.

11. A single-chamber apparatus for in-situ generation of dangerous polyatomic gases and radicals as in claim 1 wherein the heating means comprises a microwave heating source.

12. A single-chamber apparatus for in-situ generation of dangerous polyatomic gases and radicals as in claim 1 wherein the heating means comprises an electrically resistive heating source.

13. A single-chamber apparatus for in-situ generation of dangerous polyatomic gases and radicals as in claim 1 wherein the heating means comprises a pulsed heating source.

14. A single-chamber apparatus for in-situ generation of dangerous polyatomic gases and radicals as in claim 1 wherein the heating means comprises a continuous heating source.

15. A single-chamber apparatus for in-situ generation of dangerous polyatomic gases and radicals, for removal from and subsequent use outside the apparatus, the apparatus comprising:

a discharge chamber having a feedstock gas entry port for admitting one or more feedstock gases into the discharge chamber and an exit port for removing the generated dangerous polyatomic gases and radicals from the discharge chamber, the discharge chamber containing a cooled cathode for providing a plasma discharge within the discharge chamber;

a porous foamed structure contained within the discharge chamber, the porous foamed structure having a source material in means thereof;

heating means coupled adjacent the porous foamed structure for controllably heating the porous foamed structure to maintain it within a fixed temperature range, the fixed temperature range being specifically chosen such that the source material is removed from the porous foamed structure by evaporation induced by heat from said heating means while at the same time preventing consumption by evaporation of the porous foamed structure itself; and power supply means for applying electrical potentials to the cooled cathode and to the heating means.

16. A single-chamber apparatus for in-situ generation of dangerous polyatomic gases and radicals as in claim 15 wherein the source material comprises an elemental solid.

17. A single-chamber apparatus for in-situ generation of dangerous polyatomic gases and radicals as in claim 15 wherein the source material comprises an elemental liquid.

18. A single-chamber apparatus for in-situ generation of dangerous polyatomic gases and radicals as in claim 15 wherein the source material comprises a compound liquid containing a desired elemental species.

19. A single-chamber apparatus for in-situ generation of dangerous polyatomic gases and radicals as in claim 15 wherein the source material comprises a compound solid containing a desired elemental species.

20. A single-chamber apparatus for in-situ generation of dangerous polyatomic gases and radicals as in claim 15 wherein the porous foamed structure comprises a porous foamed metal containing the source material in pores thereof.

21. A single-chamber apparatus for in-situ generation of dangerous polyatomic gases and radicals as in claim 15 wherein the porous foamed structure comprises a porous foamed metal alloy containing the source material in pores thereof.

22. A single-chamber apparatus for in-situ generation of dangerous polyatomic gases and radicals as in claim 15 wherein the porous foamed structure comprises a porous foamed ceramic material containing the source material in pores thereof.

23. A single-chamber apparatus for in-situ generation of dangerous polyatomic gases and radicals as in claim 15 wherein the porous foamed structure comprises a porous foamed glass material containing the source material in pores thereof.

24. A single-chamber apparatus for in-situ generation of dangerous polyatomic gases and radicals as in claim 15 wherein the heating means comprises a radio frequency heating source.

25. A single-chamber apparatus for in-situ generation of dangerous polyatomic gases and radicals as in claim 15 wherein the heating means comprises a microwave heating source.

26. A single-chamber apparatus for in-situ generation of dangerous polyatomic gases and radicals as in claim 15 wherein the heating means comprises an electrically resistive heating source.

27. A single-chamber apparatus for in-situ generation of dangerous polyatomic gases and radicals as in claim 15 wherein the heating means comprises a pulsed heating source.

28. A single-chamber apparatus for in-situ generation of dangerous polyatomic gases and radicals as in claim 15 wherein the heating means comprises a continuous heating source.

29. A method for in-situ generation of dangerous polyatomic gases, including polyatomic radicals, for subsequent use, the method comprising:

introducing one or more hydrogen bearing feedstock gases into a discharge chamber;

establishing a plasma discharge in the discharge chamber to produce atomic hydrogen radicals from the one or more hydrogen bearing feedstock gases;

heating a porous foamed structure containing a source material in pores of said porous foamed structure, thereby producing in said discharge chamber one or more dangerous polyatomic gases and radicals having as a component said source material, the porous foamed structure being located outside the discharge chamber, and said heating being substantially accomplished by a selected one of inductive and resistive heating; and removing the produced one or more dangerous polyatomic gases and radicals from the discharge chamber for subsequent use.

30. A method for in-situ generation of dangerous polyatomic gases and radicals for subsequent use, the method comprising:

introducing one or more halogen bearing feedstock gases into a discharge chamber;

establishing a plasma discharge in the discharge chamber to produce atomic halogen radicals from the one or more halogen bearing feedstock gases;

heating a porous foamed structure containing a source material in pores of said porous foamed structure, thereby producing in said discharge chamber one or more dangerous polyatomic gases and radicals having as a component said source material, the porous foamed structure being located outside the discharge chamber, and said heating being substantially accomplished by a selected one of inductive and resistive heating; and removing the produced one or more dangerous polyatomic gases and radicals from the discharge chamber for subsequent use.

31. A method for in-situ generation of dangerous polyatomic gases and radicals for subsequent use, the method comprising:

introducing one or more hydrogen bearing feedstock gases into a discharge chamber;

establishing a plasma discharge in the discharge chamber to produce atomic hydrogen radicals from the one or more hydrogen bearing feedstock gases;

heating a porous foamed structure containing a source material in pores of said porous foamed structure, thereby producing in said discharge chamber one or more dangerous polyatomic gases and radicals having as a component said source material, the porous foamed structure being located inside the discharge chamber, and said heating being substantially accomplished by a selected one of inductive and resistive heating; and removing the produced one or more dangerous polyatomic gases and radicals from the discharge chamber for subsequent use.

32. A method for in-situ generation of dangerous polyatomic gases and radicals for subsequent use, the method comprising:

introducing one or more halogen bearing feedstock gases into a discharge chamber;

establishing a plasma discharge in the discharge chamber to produce atomic halogen radicals from the one or more halogen bearing feedstock gases;

heating a porous foamed structure containing a source material in pores of said porous foamed structure, thereby producing in said discharge chamber one or more dangerous polyatomic gases and radicals having as a component said source material, the porous foamed structure being located inside the discharge chamber, and said heating being substantially accomplished by a selected one of inductive and resistive heating; and removing the produced one or more dangerous polyatomic gases and radicals from the discharge chamber for subsequent use.

* * * * *